United States Patent
Fujisawa et al.

(10) Patent No.: US 6,437,428 B1
(45) Date of Patent: Aug. 20, 2002

(54) BALL GRID ARRAY TYPE SEMICONDUCTOR PACKAGE HAVING A FLEXIBLE SUBSTRATE

(75) Inventors: Atsushi Fujisawa; Takafumi Konno; Shingo Ohsaka, all of Hakodate; Ryo Haruta; Masahiro Ichitani, both of Kodaira, all of (JP)

(73) Assignee: Hitachi Hokkai Semiconductor, Ltd., Tokyo (JP)

( * ) Notice: Subject to any disclaimer, the term of this patent is extended or adjusted under 35 U.S.C. 154(b) by 9 days.

(21) Appl. No.: 09/596,045

(22) Filed: Jun. 16, 2000

Related U.S. Application Data

(62) Division of application No. 09/126,438, filed on Jul. 30, 1998, now Pat. No. 6,232,650.

(30) Foreign Application Priority Data

Jul. 30, 1997 (JP) ............................................ 9-204534

(51) Int. Cl.⁷ ............................................ H01L 23/495
(52) U.S. Cl. ...................................... 257/666; 257/676
(58) Field of Search ................................ 257/666, 676; 438/126, 127, 123

(56) References Cited

U.S. PATENT DOCUMENTS

| | | | |
|---|---|---|---|
| 5,218,234 A | 6/1993 | Thompson et al. | 257/787 |
| 5,590,462 A | 1/1997 | Hundt et al. | 29/840 |
| 5,592,025 A | 1/1997 | Clark et al. | 257/774 |
| 5,756,380 A * | 5/1998 | Berg et al. | 438/126 |
| 5,874,784 A * | 2/1999 | Aoki et al. | 257/787 |
| 5,886,409 A | 3/1999 | Ishino et al. | 257/737 |
| 5,917,234 A * | 6/1999 | Tsuruzono | 257/667 |
| 6,232,650 B1 * | 5/2001 | Fujisawa et al. | 257/666 |

FOREIGN PATENT DOCUMENTS

| | | |
|---|---|---|
| EP | 0702404 | 9/1995 |
| FR | 0694965 | 1/1996 |

OTHER PUBLICATIONS

"Various Types of BGA Packages that Seal 100–MHz LSIs", *Nikkei Electronics*, Feb. 28, 1994, No. 602, pp. 111–117.

* cited by examiner

*Primary Examiner*—Phat X. Cao
(74) *Attorney, Agent, or Firm*—Antonelli, Terry, Stout & Kraus, LLP

(57) ABSTRACT

In a ball grid array type semiconductor package, a semiconductor chip is mounted through an adhesive material on a surface of a flexible film substrate. Plural bump electrodes are arranged in an array on the opposite side of said substrate and the semiconductor chip is sealed by a resin. In this regard, an insulation layer is formed to cover an electric conductor layer pattern formed on the surface of the substrate, and the semiconductor chip is mounted through an adhesive material on the insulation layer. The insulation layer is divided into a plural number of parts that are mutually discontinuous in the area under the semiconductor chip. By this divided insulation layer, a short circuit between the semiconductor chip and the electric conductor layer pattern is prevented and a deformation of the substrate that comprises the flexible films is suppressed.

2 Claims, 22 Drawing Sheets

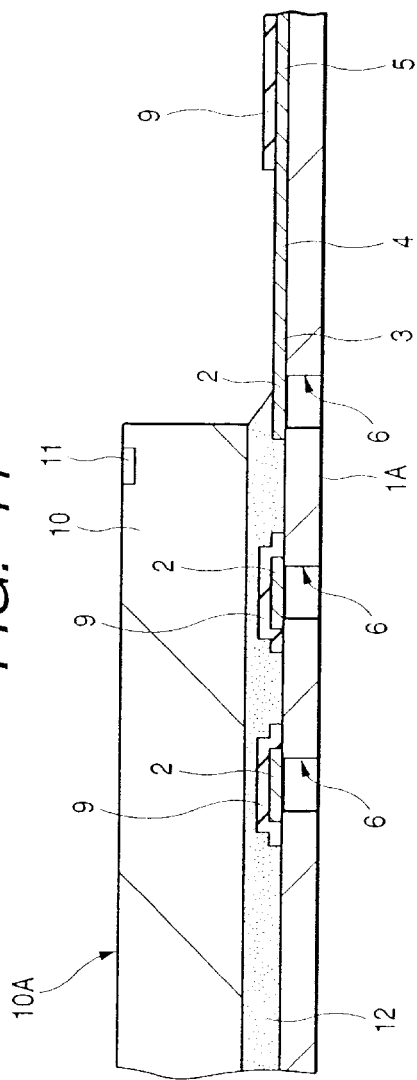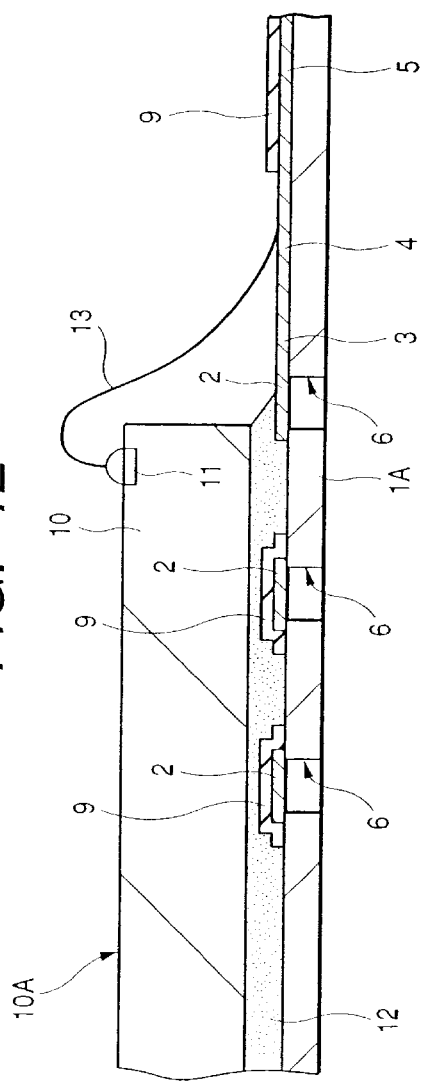

BALL GRID ARRAY TYPE SEMICONDUCTOR PACKAGE HAVING A FLEXIBLE SUBSTRATE

CROSS-REFERENCE TO RELATED APPLICATION

This application is a divisional of application Ser. No. 09/126,438, filed on Jul. 30, 1998, U.S. Pat. No. 6,232,650, the entire disclosure of which is hereby incorporated by reference.

BACKGROUND OF THE INVENTION

This invention relates to a technique that is applied to a semiconductor device, especially to a semiconductor device having a base substrate that comprises flexible films.

As a suitable semiconductor device for a high-pin-count package, a semiconductor device having a BGA (BALL GRID ARRAY) structure has been developed. In this semiconductor device with a BGA structure, a semiconductor chip is mounted on a chip mount area of a main surface of a base substrate by using adhesive material and several bump electrodes are positioned in an array on the back side thereof that is opposite to said main surface of the base substrate.

The above-mentioned base substrate is provided in the form of the rigid resin substrate that consists of glass impregnated with, for example, an epoxy resin, a polyimide resin, a maleimide resin, etc. Electrode pads for wire connection are arranged in a peripheral area that surrounds the periphery of the chip mount area of the main surface of the base substrate, and several electrode pads for bump connection are arranged on the back of the base substrate. The bump electrodes comprise solder materials of, for example, a Pb-Sn composition, which fix and connect to the electrode pads for bump connection electrically and mechanically.

The above-described semiconductor chip comprises the structure mainly of a semiconductor substrate that includes, for example, monocrystal silicon. On the semiconductor chip, a logical circuit system, a storage circuit system or a mixture of these circuit systems are formed. And, several external terminals (bonding pads) are allocated to the main surface (element formation face) of the semiconductor chip. These external terminals are electrically connected through wires to electrode pads for wire connection arranged on the main surface of the base substrate.

The semiconductor chip, the wires, the electrode pads for wire connection, etc. are sealed in the resin sealing body formed on the main surface of the base substrate. The resin sealing body is formed by a method of transfer molding, which is suitable for mass production.

A semiconductor device of the BGA structure composed like this is mounted on the surface of a printed circuit board by melting connection of the bump electrodes onto the electrode pads formed on the surface of the printed circuit board.

NIKKEI electronics (Feb. 28, 1994, from the 111th page to the 117th page) published by NIKKEI BP, describes a semiconductor device having the above-described BGA structure.

SUMMARY OF THE INVENTION

A semiconductor device having a BGA structure and using a flexible film as a base substrate has been developed in recent years. The semiconductor device of this type can be made thinner, is able to provide a high-pin-count package and is more amenable to miniaturization in comparison with a semiconductor device using a rigid resin substrate as a base substrate. However, we have found the following problems in developing semiconductor devices using a flexible film as a base substrate.

A base substrate that comprises flexible films is generally made using the following process. First, a connection hole is formed in the bump connection area of a flexible film. Then, a metal foil, such as, for example, copper (Cu), is attached to one surface of a flexible film through an adhesive material. Then, electric conductor layers that comprise electrode pads for bump connection, an electric conductor, an electrode pad for wire connection and an electric conductor for plating etc. are formed by patterning on the metal foil. Then, an insulation layer that protects the electric conductor layer is formed. Then, plating processing to form a plating layer on the electrode pad for bump connection and wire connection is carried out. Plating processing is done by a method of electrolytic plating. This plating processing is sometimes performed in the step before forming the insulation layer. The plating layer is formed on, for example, a gold (Au)/ nickel (Ni) film or a gold (Au)/palladium (Pd)/nickel (Ni) film.

The above insulation layer is formed by the following process, for example. First, a photosensitive resin film is formed on one surface of a flexible film. Then, after performing a baking processing, by using a photograph printing technique, photosensitive processing, development processing and cleaning are performed. The insulation layer is formed on all areas of the one surface of the flexible film containing the electric conductor layers, except for the electrode pads for wire connection. That is, insulation layers are formed on almost all areas of the one surface of the flexible film. Therefore, warp and distortion, etc. arise in the base substrate. This deformation of a base substrate causes a transfer problem during the manufacturing process (assembly process) of a semiconductor device. And, this deformation of a base substrate becomes a cause of a further problem in the process that mounts a semiconductor chip, in that the wetting performance of the adhesive material being used is deteriorated.

As for the cause of deformation of the above-described base substrate, it is a main factor that the thermal expansion coefficient and the hardening shrinkage rate of an insulation layer are large. But, in case an insulation layer is not formed on the flexible film, the following problems arise.

(1) Electrode pads for bump connection are arranged on the chip mount area of a main surface of a base substrate. Therefore, when mounting a semiconductor chip through the use of an adhesive insulation material to the chip mount area on a main surface of the base substrate, it is difficult to control the thickness of the adhesive material. And, if the semiconductor chip should touch the electrode pads for bump connection, a short circuit could arise between them.

(2) Electrode pads for bump connection are arranged on the chip mount area of the main surface of the base substrate. Bump electrodes arranged on the back side of the base substrate are connected to these electrode pads for bump connection through connection holes formed in the chip mount area of the base substrate. That is, bump electrodes are arranged in the area under a semiconductor chip.

The electrode pads for bump connection arranged on the chip mount area of the above-described base substrate are integrated and are electrically connected through electric conductors to the electrode pads for wire connection arranged on the peripheral area that surrounds the chip mount area of the main surface of the base substrate. That is, in the peripheral area of the main surface of the base substrate, electric conductors are arranged on the area between a semiconductor chip and the electrode pads for wire connection. Therefore, when connecting the external terminals of a semiconductor chip and pads for wire connection with wires, other electric conductors that adjoin electric conductors electrically connected to the wires and these wires sometimes cross themselves. In case there is a sufficient height for the wire connection, there is no problem. However, there is some possibility of a short circuit with wires and other electric conductors, when wires and other electric conductors are not arranged in parallel at the corner of a semiconductor chip. And, there is a possibility that, in case wires and other electric conductors cross each other on the side of electrode pads for wire connection, a short circuit with these wires and other electric conductors may also arise.

It is an object of the present invention to provide a technique which makes it possible to suppress deformation (warp and distortion) of a base substrate in a semiconductor device when the base substrate comprises flexible films.

It is another object of the present invention to provide a technique which makes it possible to suppress deformation of a base substrate in a semiconductor device when the base substrate comprises flexible films and to prevent a short circuit between electric conductors of the base substrate and the semiconductor chip.

It is another object of the present invention to provide a technique, in a semiconductor device with a base substrate that comprises flexible films, that makes it possible to suppress deformation of the base substrate and to prevent an electric conductor layer of the base substrate and connection wires from short-circuiting.

These and other objects, features and advantages of the invention will become more apparent upon a reading of the following description in conjunction with the appended drawings.

A summary of the invention as disclosed in this application will be explained as follows.

(1) A semiconductor device has electric conductors arranged on a main surface of a base substrate that comprises flexible films and a semiconductor chip is mounted by using a adhesive material on the main surface of the base substrate. Individual insulation members are arranged on said electric conductor layers on the main surface of the base substrate, so that respective insulation members are apportioned, for example, to respective electric conductors.

(2) A semiconductor device has electric conductors arranged in a chip mount area of a main surface of a base substrate that comprises flexible films and a semiconductor chip is mounted by using an adhesive material on the chip mount area of the main surface of the base substrate. Individual insulation members are arranged on said electric conductors of the main surface of the base substrate, so that the respective insulation layers are apportioned, for example, to respective electric conductors.

(3) A semiconductor device has a semiconductor chip mounted in a chip mount area of a main surface of a base substrate, which is made of flexible film, by using an adhesive material. Electrode pads for wire connection are formed in a peripheral area that surrounds said chip mount area. Electric conductors are arranged between said semiconductor chip and said electrode pads for wire connection in said peripheral area. External terminals of said semiconductor chip and said electrode pads for wire connection are electrically connected through wires. Individual insulation members are arranged, respectively, on said electric conductors.

By means of (1) mentioned above, since stress produced by contraction or expansion and hardening of an insulation film is relieved, deformation (warp and distortion) of the base substrate can be suppressed.

By means of (2) mentioned above, since the semiconductor chip does not tough the electric layers due to the presence of the insulation members, when a semiconductor chip is mounted on the chip mount area of the main surface of the base structure using an adhesive material, a short circuit between the electric conductor layers and the semiconductor chip can be prevented.

By means of (3) mentioned above, since the connection wires do not touch the electric conductors, a short circuit between the electric conductors on the base substrate and the wires can be prevented.

BRIEF DESCRIPTION OF THE DRAWINGS

FIG. 11 is a cross-sectional view in the step of a method of manufacturing the above semiconductor device;

FIG. 12 is a cross-sectional view in the step of a method of manufacturing the above semiconductor device;

DESCRIPTION OF THE PREFERRED EMBODIMENT

Figure 1:
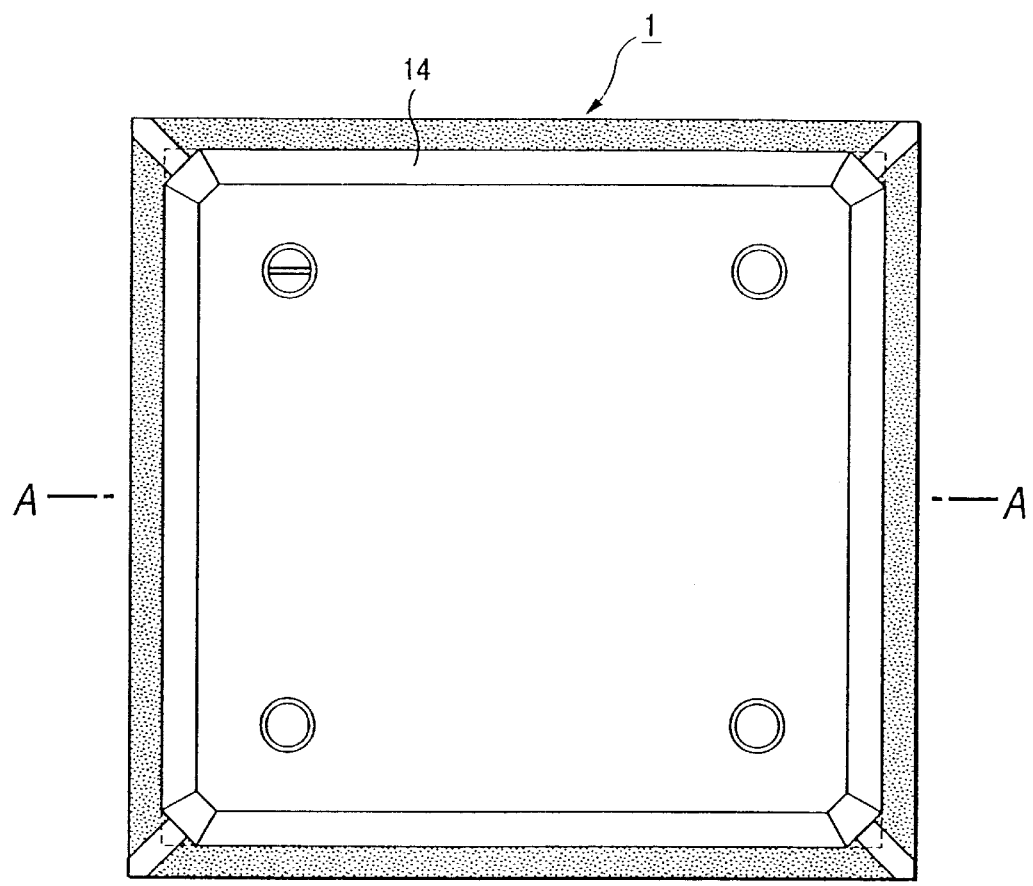
FIG. 1 is a plan view of a semiconductor device representing one embodiment of this invention.

An embodiment of this invention, which is applicable to a semiconductor device having a BGA structure, will be explained. The same reference numerals are used to identify elements having the same function in the several drawings and repeated explanation of such elements is omitted in this description.

Figure 2:
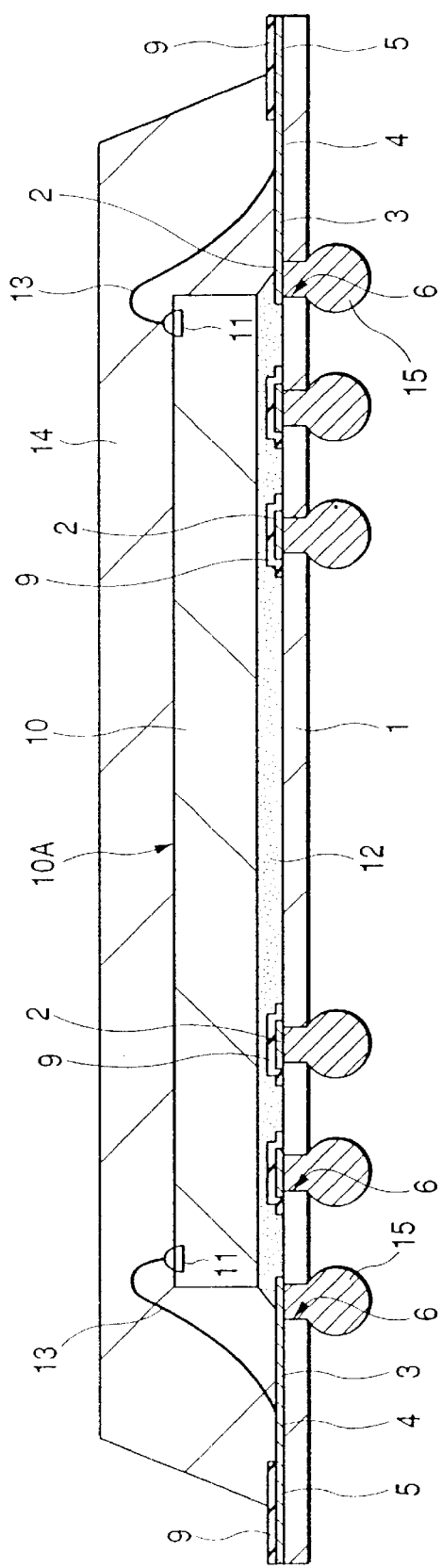
FIG. 2 is an enlarged sectional view taken along the A—A line in FIG. 1.
Figure 3:
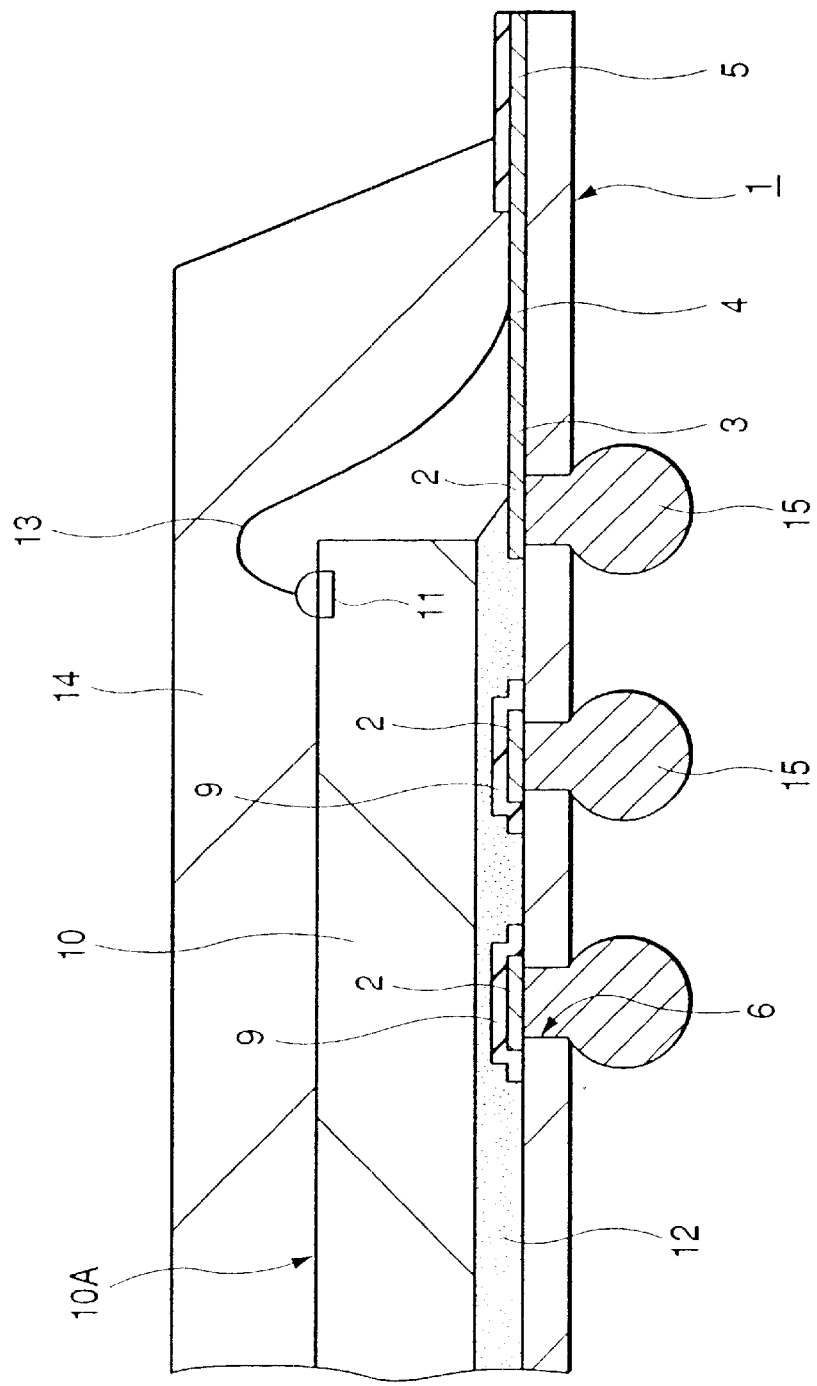
FIG. 3 is an enlarged view of a part of FIG. 2.
Figure 4:
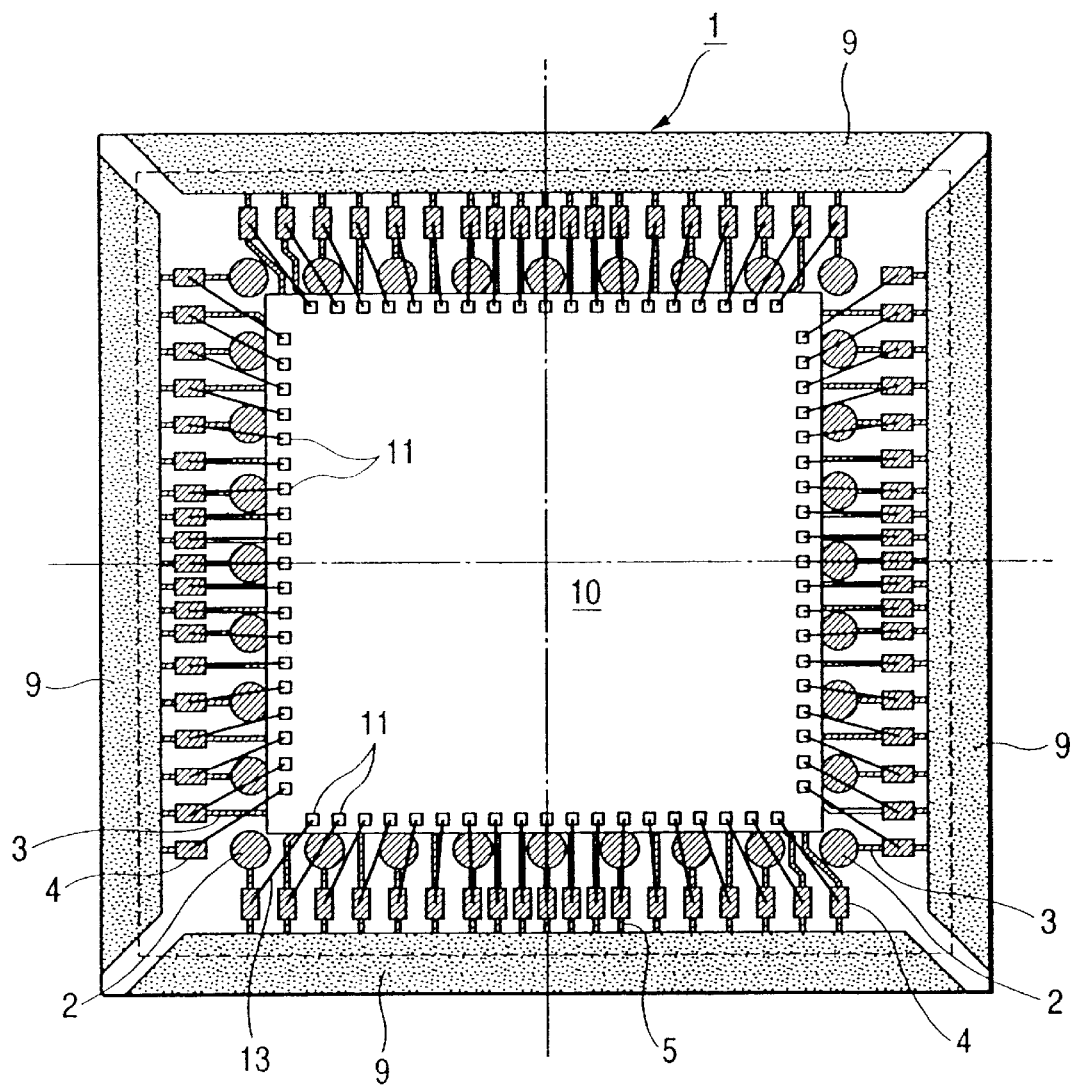
FIG. 4 is a plan view wherein the resin sealing body of the semiconductor device is removed.
Figure 5:
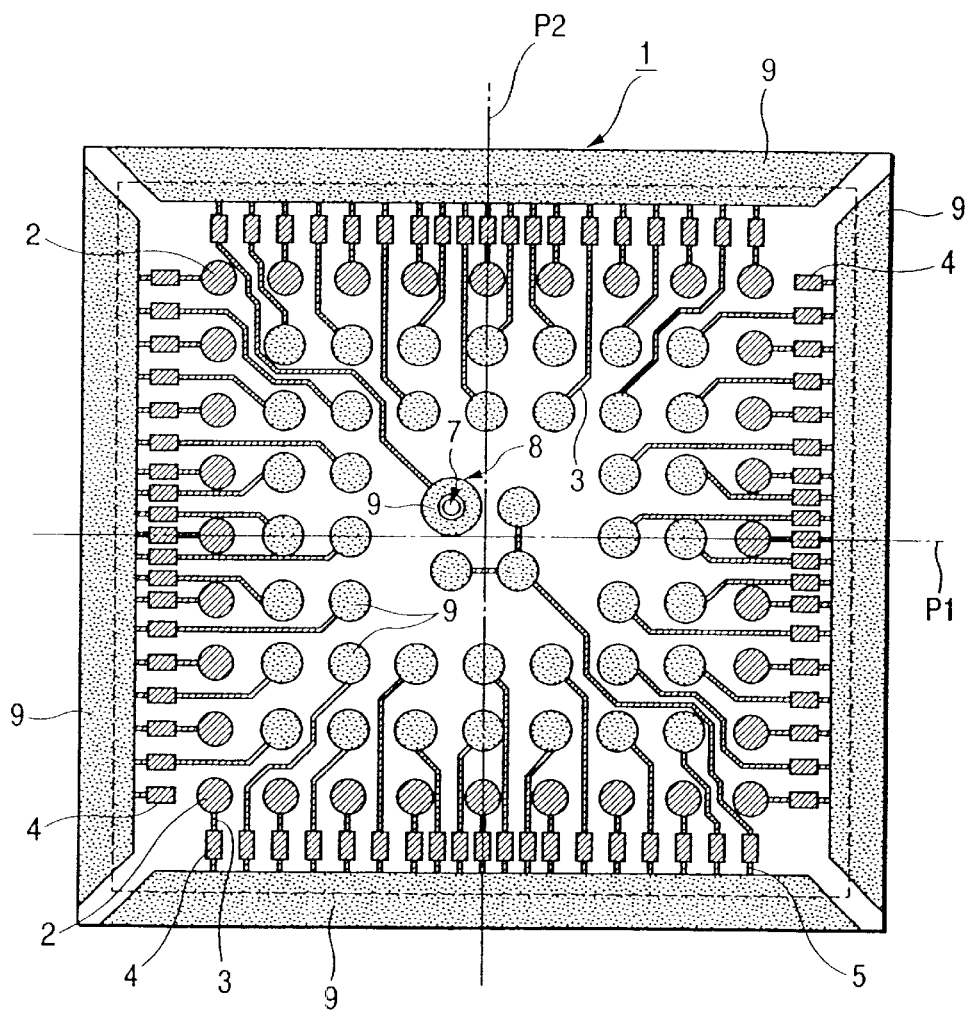
FIG. 5 is a plan view of a base substrate.
Figure 6:
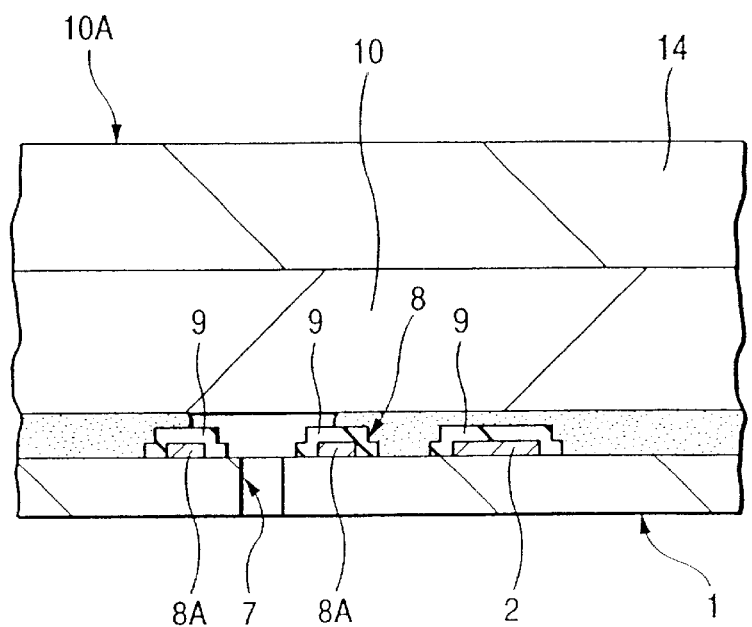
FIG. 6 is an enlarged sectional view of a main part of the semiconductor device.

FIG. 1 is a plan view of a semiconductor device representing one embodiment of this invention. FIG. 2 shows an enlarged sectional view taken along the A—A line in FIG. 1. FIG. 3 is an enlarged sectional view of part of FIG. 2. FIG. 4 is a plan view which shows the device with the resin sealing body removed. FIG. 5 is a plan view of the base substrate. FIG. 6 is an enlarged sectional view of part of the semiconductor device.

As shown in FIG. 1, FIG. 2 and FIG. 3, the semiconductor device has the following structure. Semiconductor chip 10 is mounted by using adhesive material 12 on the chip mount area of the main surface of a base substrate 1. And, several bump electrodes 15 are positioned in an array on the back side of the device that is opposite to the main surface of the base substrate 1. Bump electrodes 15 are formed of a solder material, such as, for example, 63 weight % Pb-37 weight % Sn composition. The semiconductor device of this embodiment is a surface-mounted type BGA (Ball Grid Array) package and it is called a CSP (CHIP SIZE PACKAGE), which has a chip mounting area almost equal to the size of the semiconductor chip.

The plane shape of the base substrate 1 is formed in a square-form. This base substrate 1 is made of a flexible film that comprises insulation resins of, for example, an epoxy system or the insulation resin of a polyimide system. Base substrate 1 is set to a thickness of 50 micron [μm], for example.

The electric conductor layers that comprise electrode pads 2 (bump land) for bump connections, electric conductors 3 and electrode pads 4 for wire connections, electric conductors 5 for plating, etc. are arranged on the main surface of the base substrate. Several electrode pads 2 for bump connection and electrode pads for wire connection are provided, and several electric conductors 3 and electric conductors 5 for plating are provided. That is, several electric conductor layers are arranged on the main surface of the base substrate 1. Electrode pads 2 for bump connection are integrated with electrode pads 4 for wire connection through electric conductors 3 and are electrically connected to each other. Electric conductors 5 for plating are integrated with electrode pads 4 for wire connection and are electrically connected to each other. Electrode pad 2 for bump connection, electric conductors 3, electrode pads 4 for wire connection and electric conductors 5 for plating etc. are formed by etching processing on a metal foil after sticking metal foil, for example, Cupper (Cu) foil, to the main surface of a flexible film using adhesive materials. These electrode pads 2 for bump connection and electric conductors 3, electrode pads 4 for wire connection and electric conductors 5 are set to a thickness of 18 micron [μMs], for example.

The plane shape of the above semiconductor chip 10 is formed in a square-form. This semiconductor chi 10 has a structure mainly of the semiconductor substrate, that comprises, for example, monocrystal silicon. To semiconductor 10, a logical circuit system, a storage circuit system or a mixture of those circuit systems are formed. These circuit systems are formed by connecting several semiconductor elements mounted on the main surface (element formation face) 10A of the semiconductor chip 10 through the electric conductors.

Several external terminals (bonding pads) 11 arranged along each side of semiconductor chip 10 are arranged on the main surface 10A of the semiconductor chip 10. Each of the several external terminals 11 extend to the top layer of the electric conductor layers formed on the main surface of the semiconductor substrate, and are made of, for example, aluminum (Al) film or an aluminum alloy film. And, each of the several external terminals 11 are electrically connected to circuit systems formed in the semiconductor chip 10.

A majority of the several electrode pads 2 for bump connection are arranged in the chip mount area of the main surface to the base substrate 1. Other (remainder) electrode pads 2 for bump connection are arranged in the peripheral area that surrounds the chip mount area of the main surface of the base substrate 1. Several bump electrodes 15 arranged on the back side of the base substrate 1 are fixed on the back of each of these several electrode pads 2 for bump connection through connection holes 6 formed in the base substrate 1, and they are connected electrically and mechanically. And, in this embodiment, the plane shape of the electrode pads 2 for bump connection is that of a circle.

As shown in FIG. 2, FIG. 3 and FIG. 4, each of the electrode pads 4 for wire connection are arranged in the peripheral area of the main surface of the base substrate 1 and the pads 4 are arranged along each side of the semiconductor chip 10. Each of the electrode pads 4 are electrically connected to each of several external terminals 11 arranged on the main face 10A of the semiconductor chip 10 through wires 13. For example, Au wires may be used as the wires 13. Wires 13 are connected by a bonding method, such as one which uses ultrasonic vibration in combination with thermo compression bonding, for example.

Electric conductors 3 are arranged on the chip mount area of the main surface of the base substrate 1 and extend from the chip mount area to electrode pads 4 in the peripheral area of the main surface of the base substrate 1. Also, electric conductors 3, integrated with electrode pads 2 for bump connection, are arranged in the peripheral area of the main surface of the base substrate 1 and extend in the peripheral area of the main surface of the base substrate 1 to respective electrode pads 4. That is, in the peripheral area of the main surface of the base substrate 1, electric conductors 3 are arranged in the area between the semiconductor chip 1 and the electrode pads 4 for wire connection.

The semiconductor chip 10, electric conductors 3, electrode pads 4 and wires 13, etc. are sealed in a resin sealing body 14. The resin sealing body 14 is formed of a resin of an epoxy system to which, for example, a phenol system hardener, silicone rubber and a filler are added for the purpose of obtaining a lower stress. This resin sealing body 14 is formed by a transfer molding method suitable for mass production. The transfer molding method uses a molded die assembly with a pot, a runner, a gate, a cavity, etc., and represents a method of injecting a resin in the cavity through the runner and the gate from the pot for forming a resin sealing body.

Each of the electric conductors 5 is arranged outside the electrode pads 4 for wire connection in the peripheral area of the base substrate 1. The electric conductors 5 are arranged along each side of semiconductor chip 10. A part of the electric conductors 5 is arranged inside of the resin sealing body 14, and a part is arranged outside of the resin sealing body.

As shown in FIG. 2, FIG. 3 and FIG. 5, insulation layers 9 are arranged over the surface of each of the several electrode pads 2 for bump connection which are arranged in the chip mount area on the main surface of the base substrate 1. These insulation layers 9 are provided individually for each of the electrode pads 2 for bump connection in the chip mount area of the main surface of the base substrate 1. Insulation layers 9 are provided as individual areas so as to be scattered in the chip mount area of the main surface of the base substrate 1. That is, the semiconductor device of this embodiment separates the insulation layers 9 into several parts in the chip mount area of the main surface of base substrate 1 and arranges each insulation layer 9 on a respective electrode pad 2 for bump connection. The plane shape of an insulation layer 9 arranged on an electrode pad 2 for bump connection in this embodiment is in the form of a circle.

On the surface of each of the electric conductors 5 in the peripheral area along each edge of the base substrate 1, insulation layers 9 are arranged. These insulation layers 9 extend along each side of the base substrate 1 and are separated at the corners of the base substrate 1, so that separate insulation layers 9 are provided for each edge in the peripheral area of the base substrate 1. That is, the semiconductor device of this embodiment divides insulation layer 9 into several parts or members in the peripheral area on the surface of the base substrate 1, and these insulation layers 9 are arranged on the electric conductors 5.

One part of the insulation layers 9 is arranged on the electric conductors 5 inside of the resin sealing body 14, and the other part is arranged outside the resin sealing body 14. That is, the insulation layers 9 are interposed between the electric conductors 5 and resin sealing body 14.

As shown in FIG. 5 and FIG. 6, a vent hole 7 is provided in the chip mount area of the base substrate 1. By providing a vent hole 7 in the chip mount area of the base substrate 1, the gas that is produced at the same time of hardening of the adhesive material 12, when applying the adhesive material 12 on the chip mount area of the base substrate 1 and mounting the semiconductor chip 10 thereon, can be emitted to the outside. And, the steam that is produced in adhesive material 12 by the heat generated at the time of surface-mounting of the semiconductor device on the surface of the substrate, or the heat generated at the time of a temperature cycle test as part of an environmental test carried out after product completion of the semiconductor device, can be emitted to the outside.

On the chip mount area of the base substrate 1, a dam 8 surrounds the periphery of the vent hole 7. Dam 8 is composed of a conduction film 8A and insulation layers 9 arranged on the conduction film 8A.

The vent hole 7 is arranged at a position that is deviated from the center line P1 in the X direction (horizontal direction in the figure) of base substrate 1 and from the center line P2 in the Y direction (vertical direction in the figure) of base substrate 1, as shown in FIG. 5. That is, vent hole 7 is arranged at a position that is deviated from the center of the base substrate 1. When the semiconductor device is viewed from the side of the base substrate 1, the arrangement of the position of the vent hole 7 that is deviated from the center of the base substrate 1 can clear a direction as an index. And, because a direction can be cleared as an index, vent hole 7 can be used as an index.

Figure 7:
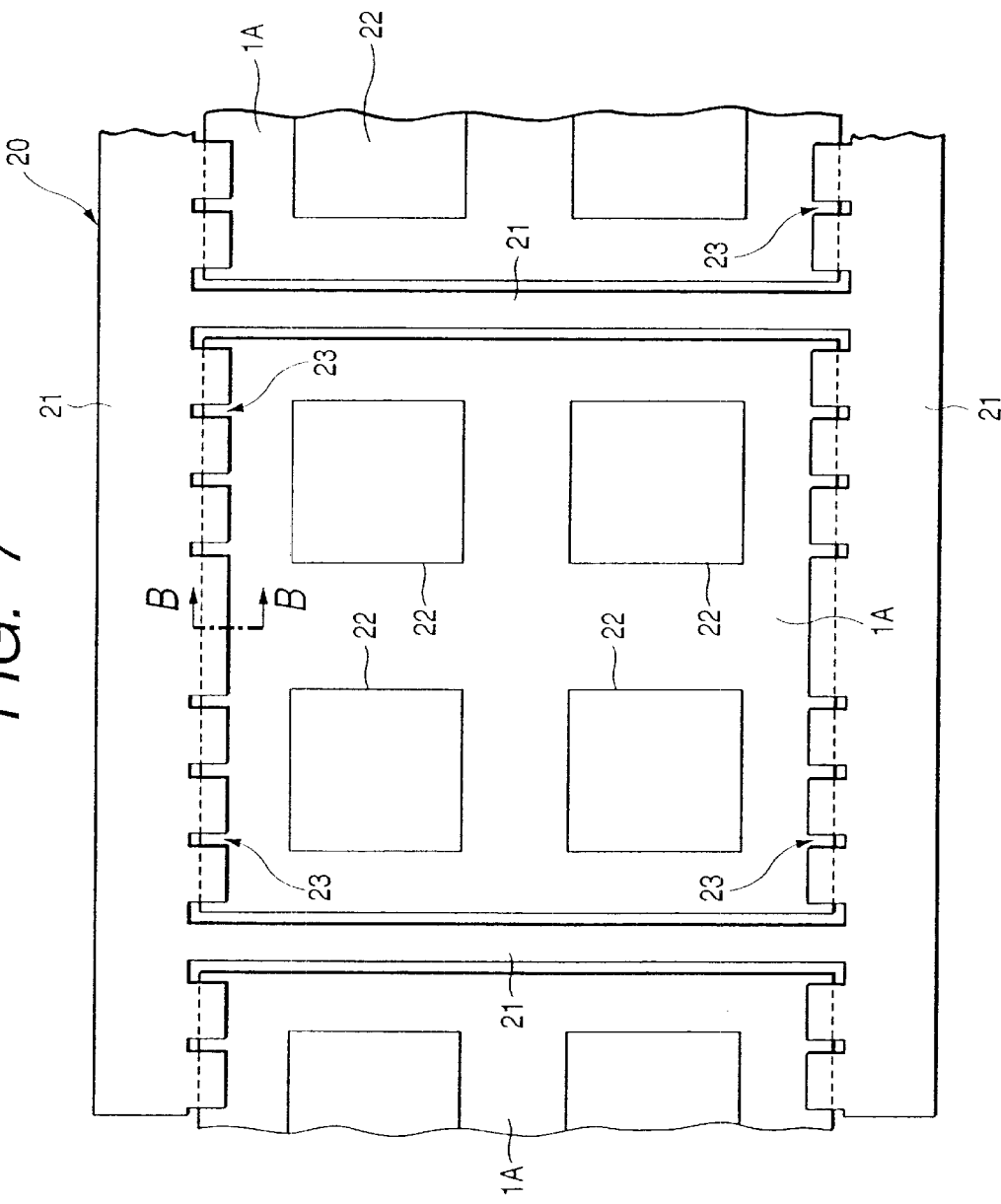
FIG. 7 is a plan view of a main part of the frame structure that is used in the manufacturing process of the semiconductor device.

Now, the frame structure that is used in the manufacturing process of the above semiconductor device will be explained. While the frame structure 20 is not limited to one particular construction, it may be composed of a matrix frame structure in which unidirectionally several areas are specified in, for example, a frame body 21, as shown in FIG. 7. Film base material 1A is arranged in each area specified in the frame body 21. Film base material 1A of this embodiment has four (4) resin sealing areas 22. That is, the film base material 1A is configured to form four (4) products arranged in respective areas in frame body 21. And, an electric conductor layer pattern is shown in FIG. 5 is formed in each resin sealing area 22.

The frame body 21 is formed by etching processing or press punching on a board material. A Cu system alloy materials may be used as the board material, for example.

Figure 8:
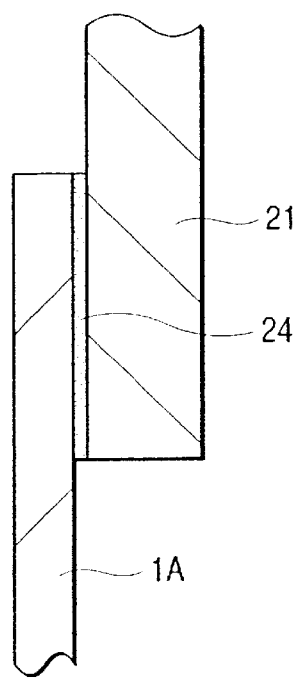
FIG. 8 is an enlarged sectional view taken along the B—B line in FIG. 7.

As shown in FIG. 7 and FIG. 8, the film base material 1A is fixed to two (2) portions of adhesion area where parts of the frame body 21 are opposed to each other using an adhesive material. Slits 23 are provide din-each adhesion area of the frame body 21. This slit 23 provides a specified space in the longitudinal direction of the frame structure 20, and several slots are arranged in the adhesion area. By providing slits 23 in the adhesion area of frame body 21 because stress resulting from a difference between the materials of the frame body 21 and the film base material 1A can be relieved, warping, distortion, etc. of the film base material 1A can be suppressed.

Now, a method of manufacturing the above-mentioned frame structure 20 will be explained by reference to FIG. 9 and FIG. 10.

Figure 9A:
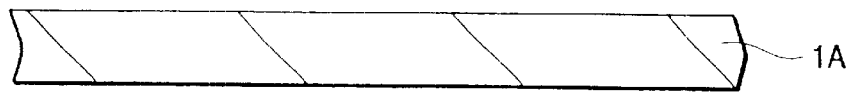
FIGS. 9(A) to 9(E) are cross-sectional views at the steps of a method of manufacturing the above frame structure.
Figure 9B:
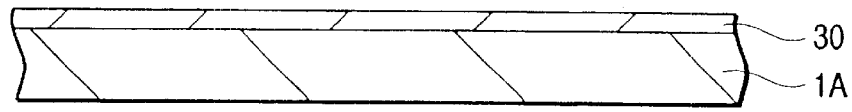

First, as shown in FIG. 9(A), film base material 1A is prepared. Film base material 1A is made of the insulation resin of, for example, an epoxy system or an insulation resin of a polyimide system. Then, as shown in FIG. 9(B), adhesive material 30 is attached to one surface of the film base material 1A. It also can be attached by heat pressurization without using the adhesive material 30.

Figure 9C:
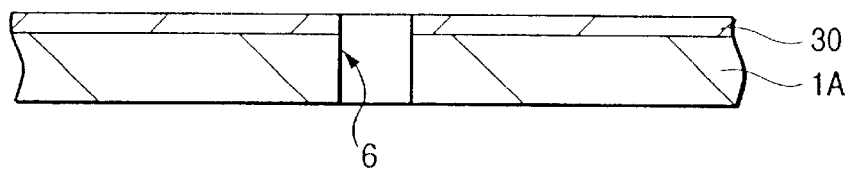
Figure 9D:
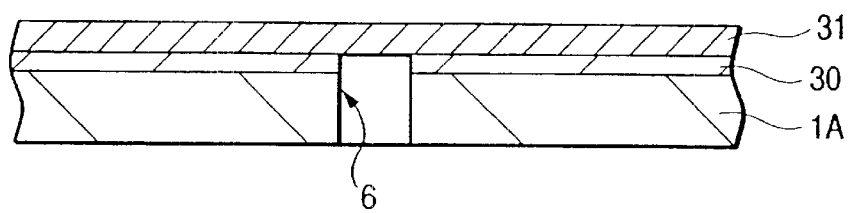

Then, a connection hole 6 is formed in the bump connection area of the film base material 1A, as shown in FIG. 9(C), and a vent hole 7 is formed in the chip mount area of film base material 1A, although this is not illustrated. Connection hole 6 and vent hole 7 are formed by, for example, die assembly, laser manufacture, etc. Then, as shown in FIG. 9(D), a metal foil (the Cu foil, for example) 31 is attached to the surface of the film base material 1A using connection material 30. After attaching the metal foil 31 to the film base material 1A, the connection hole 6 and vent hole 7 can be extended therethrough by a die assembly or laser manufacture, etc.

Figure 9E:
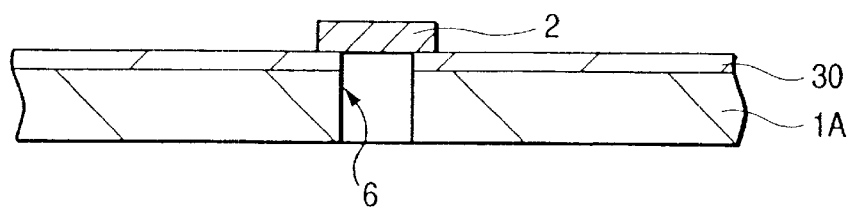

Then, while electrode pads 2 for bump connection are formed on one surface of the film base material 1A, as shown in FIG. 9(E), patterning is carried out on metal foil 31 to form electric conductors 3 and electrode pads 4, electric conductors 5, etc. for plating for wire connection, although this is not illustrated. That is, an electric conductor layer pattern is formed in this process. And, a conduction film 8A is formed to surround the periphery of vent hole 7 in the chip mount area, although this also is not illustrated.

Figure 10A:
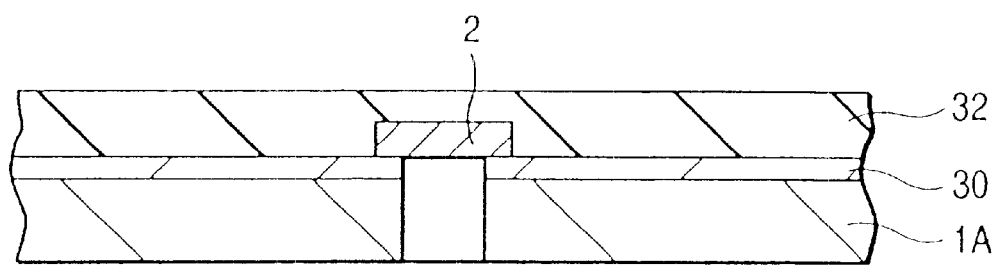
FIGS. 10(A) and 10(B) are cross-sectional views at the steps of a method of manufacturing the above frame structure.
Figure 10B:
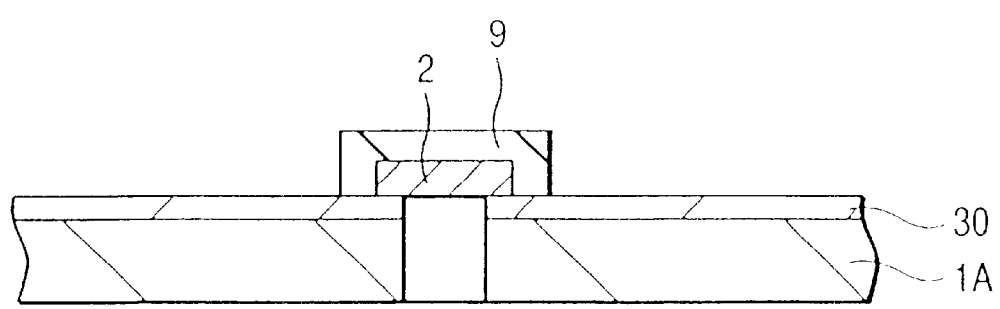

Then, as shown in FIG. 10(A), a photosensitive resin film 32 of uniform film thickness is formed over the whole area of the film base material 1A, including the electric conductor layer pattern. The photosensitive resin film 32 is formed by a method of screen printing. Then, after baking processing, a photograph printing technique, that is, photosensitive processing, development processing and cleaning, etc., is carried out as shown in FIG. 10(B), so that an insulation layer 9 of a specified pattern is formed. In this process, as shown in FIG. 5, individual insulation layers 9 are arranged on the respective electric conductor layers. And, the dam 8, that also comprises insulation layers 9 arranged on the conduction film 8A, and this conduction film 8A are also formed in this process. In a case where the insulation layers 9 are arranged on the whole surface on the film base material 1A, the difference between material characteristics of the film base material 1A, the electric conductor layers and the insulation layers 9 would tend to cause the base substrate 1 to warp, and distortion thereof to arise. But, by dividing and arranging the insulation layers 9 over individual areas, as provided in this embodiment, a deformation of the base substrate 1 can be suppressed because stress due to shrinkage or expansion and hardening of the insulation layers 9 is relieved.

Then, a plating layer (for example, an Au/Ni layer, an Au/Pd/Ni, Pd/Ni layer and a Sn/Ni layer, etc.) that is able to be bonded is formed by plating processing, using a method of electrolytic plating, on the electric conductor layer which is not covered by said insulation layers. The frame structure that is shown in FIG. 7 is formed after this by cutting the film base material 1A into individual pieces and attaching the pieces to the adhesion area of frame body 21 using the adhesive material 24. A transfer of the film base material 1A during the manufacturing process (assembly process) of a semiconductor device is improved, and formation of a frame structure 20, that has film base material 1A at an area specified in the frame body 21 like this, such that the film base material IA is attached to the adhesion area of frame body 21, improves handling.

Now, a method of manufacturing the semiconductor device will be explained.

First, the frame structure 20 shown in FIG. 7 is prepared. Frame structure 20 has film base material 1A in the area specified in frame body 21. Resin sealing areas 22 are arranged on the film base material 1A, and the electric conductor layer pattern that is shown in FIG. 5 is formed on this resin sealing area 22.

Then, a semiconductor chip 10 is mounted using adhesive material 12 on the chip mount area of the main surface of the film base material 1A, as shown in FIG. 11. Adhesive material 12 is applied to the chip mount area by the multi-point potting method. The heat curable insulation resin of, for example, an epoxy system or a polyimide system, is used as an adhesive material 12. As the adhesive material 12, a thermoplastic insulation resin of, for example, an epoxy system or a polyimide system is also fine. Gas that is produced at the time of hardening of the adhesive material 12 is exhausted through the vent hole 7, as shown in FIG. 6, which is provided in the chip mount are of film base material 1A so that the gas can be set free to the outside. And, the inflow of the adhesive material 12 to the vent hole 7 can be stemmed or prevented because of building dam 8 that surrounds the periphery of vent 7, as shown in FIG. 6. Therefore, the prevention of blockage of the vent hole 7 by the adhesive material 12 and the inward intrusion of adhesive material 12 to the back side of the film base material 1A can be prevented. And, even if the semiconductor chip 10 is mounted in a state where it is tilted and the film thickness of the adhesive material 12 thins, the semiconductor chip 10 does not touch the electrode pads 2 for bump connection because insulation layers 9 are arranged on electrode pads 2. And, even if the semiconductor chip 10 is mounted in a state in which it is tilted and the film thickness of the adhesive material 12 thins, the semiconductor chip 10 touches the insulation layers 9, but does not touch the electric conductors 3 because it is supported by the insulation layers 9.

Then, as shown in FIG. 12, the external terminal 11 of the semiconductor chip 10 and electrode pads 4 for wire connection of the film component 1A are electrically connected with wires 13. Au wires are used as wires 13.

Figure 13:
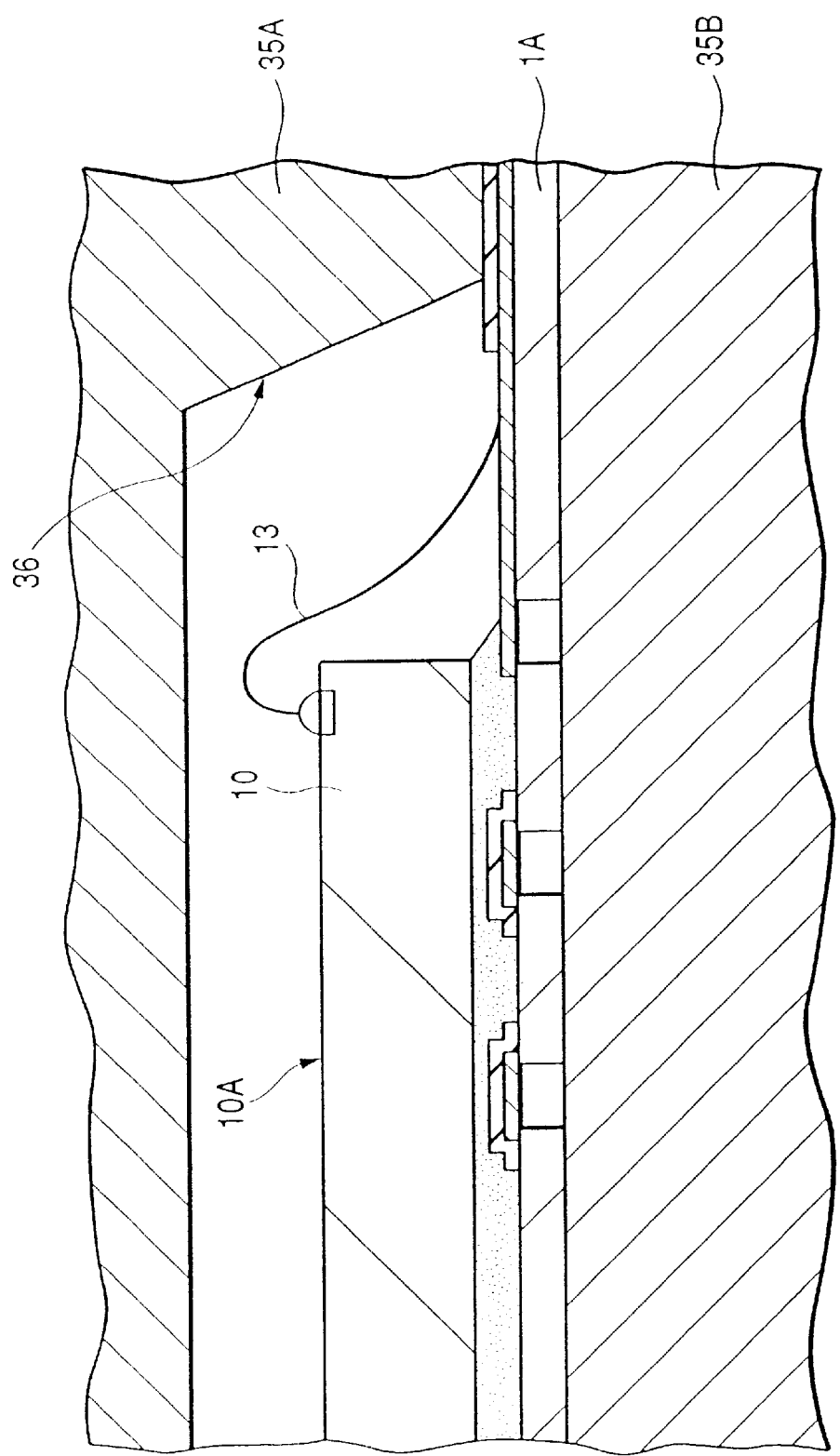
FIG. 13 is a cross-sectional view in the step of a method of manufacturing the above semiconductor device.
Figure 14:
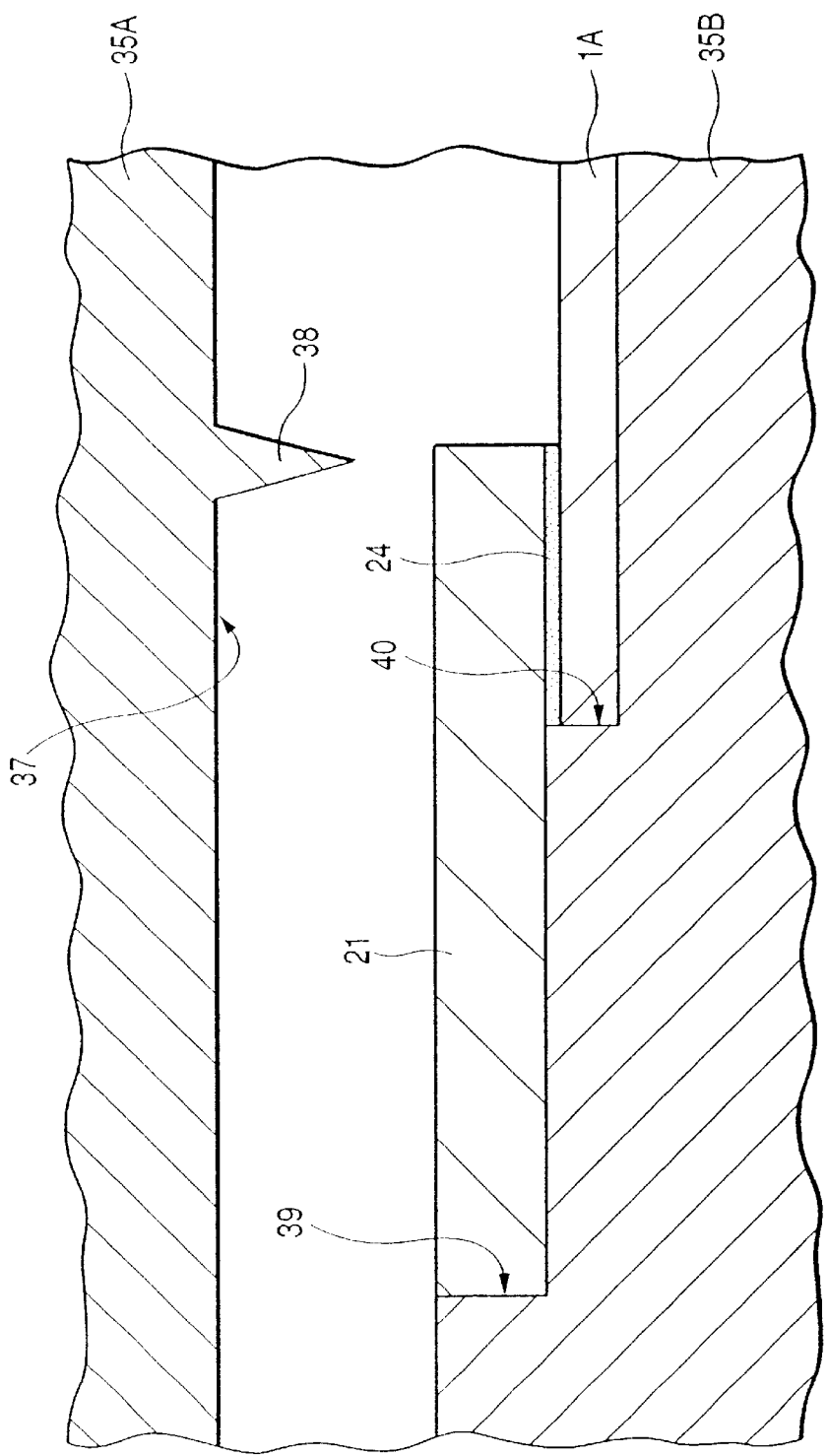
FIG. 14 is a cross-sectional view in the step of a method of manufacturing the above semiconductor device.

Then, the frame structure 20 is set into a molding die assembly. As shown in FIG. 13, resin sealing area 22, semiconductor chip 10, wires 13, etc. of film base material 1A are arranged in a cavity 36 that is formed by an upper die 35A and a lower die 35B of the molding die assembly. AS shown in FIG. 14, the molding die assembly includes a sub-runner (trunk runner) 37 and a protrusion 38, and further, although not illustrated, an inflow gate, a main runner (main runner) and a pot are provided. The pot is connected to the cavity 36 through the main runner, sub-runner 37 and an inflow gate.

The lower die 35B of the above molding die assembly has a stepped portion 39 against which frame body 21 of the frame structure 20 is installed and a stepped portion 40 against which film base material 1A is installed. That is, frame body 21 of the frame structure 20 is installed in stepped portion 39 of the lower die 35B and film base material 1A of the frame structure 20 is installed in the stepped portion 40 of the lower die 35B. Vertical matching of the upper die 35A and the lower die 35B is done in the structure of frame body 21- adhesive material 24- film base material 1A.

While not illustrated in detail, the sub-runner 37 crosses stepped portion 39 in which frame body 21 of frame structure 20 is installed and stepped portion 40 in which film base material 1A is installed and exists from the outside of frame structure 20 to the inside thereof and connects to the cavity 36 through the inflow gate. The main runner exists and extends in the longitudinal direction along the outside of the frame structure 20 and connects to the one end of said sub-runner 37 withdrawn outside of frame structure 20. And, the protrusion 38 is provided for ease in cutting the resin which has stiffened inside of sub-runner 37. This protrusion 38 is positioned on the area of the stepped portion that is formed in frame body 21 of frame structure 20 and film base material 1A.

Figure 15:
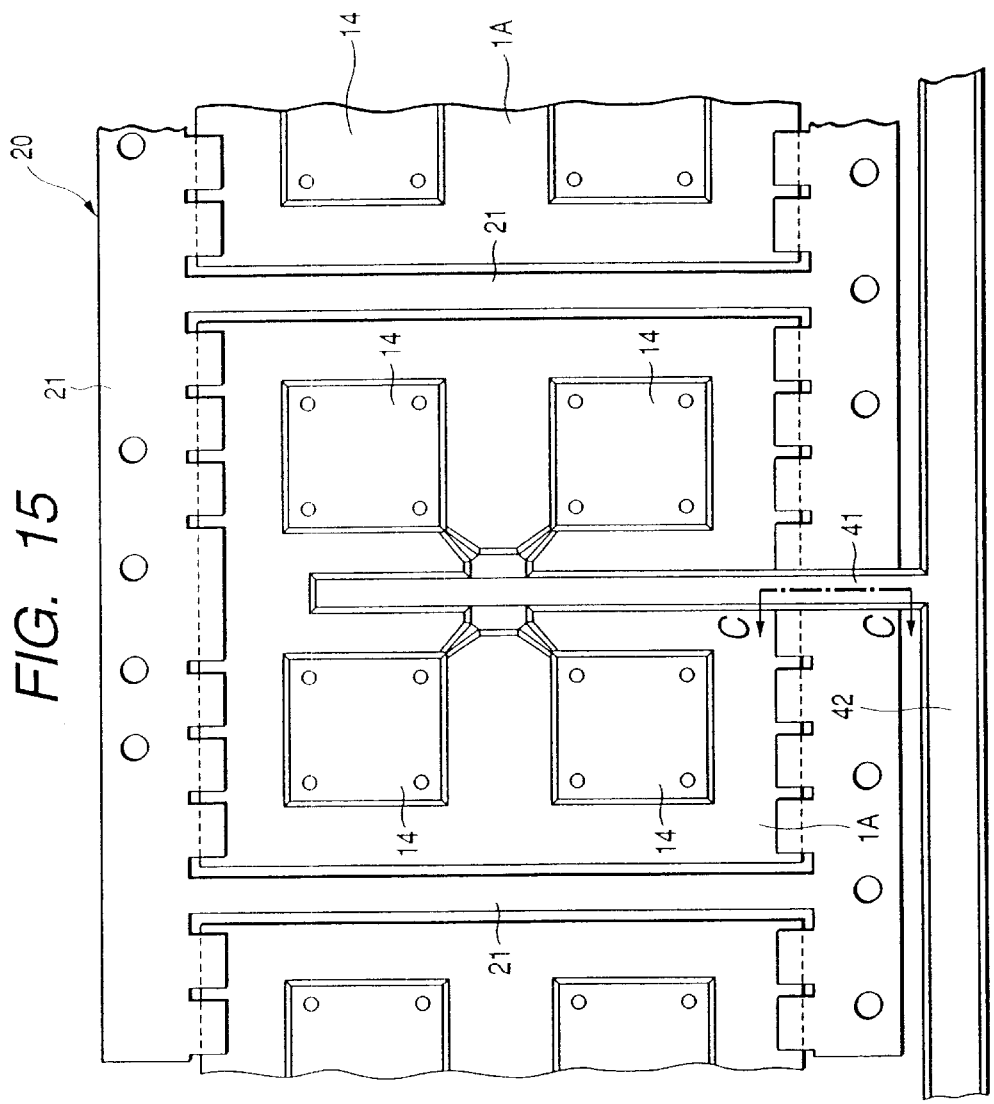
FIG. 15 is a plan view to explain a method of manufacturing the above semiconductor device.

Then, a resin tablet is put into the pot. This resin tablet is pressurized in the plunger of the transfer mold equipment, and a resin is supplied into cavity 36 through each of the main runner, sub-runner 37 and an inflow gate from the pot. Thus, resin sealing body 14 is formed. After this, frame structure 20 is taken out from the molding die assembly. The state of the frame structure 20 which has been unloaded from the molded die assembly is shown in FIG. 15. In FIG. 15, reference numeral 41 denotes a sub-runner resin stiffened in a sub-runner 37 of the molding die assembly, and reference numeral 42 denotes main-runner resin stiffened in the inside of the main-runner of the molding die assembly. Main-runner resin 42 extends in the longitudinal direction of the frame structure 20. Sub-runner resin 41 extends from the outside of the frame body 21 to the inside thereof. And FIG. 14 shows a cross-sectional view taken along the C—C line in FIG. 15.

Figure 16:
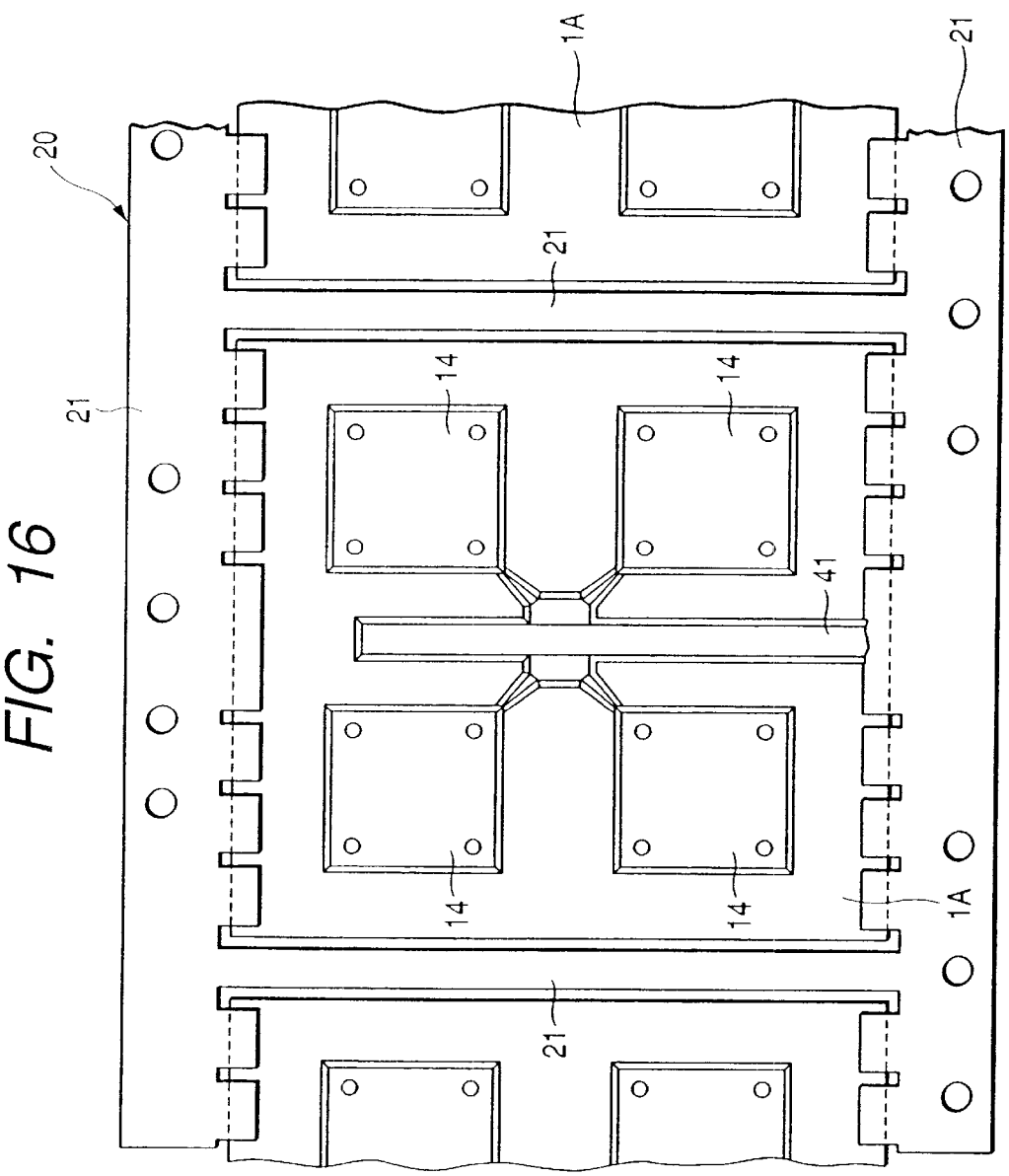
FIG. 16 is a plan view to explain a method of manufacturing the above semiconductor device.

Then, sub-runner stiffened resin 41 and main runner stiffened resin 42 that extend outside of the frame body 21 are removed. Sub-runner resin 41 that exists inside of the frame body 21 is left. This state is shown in FIG. 16.

Figure 17:
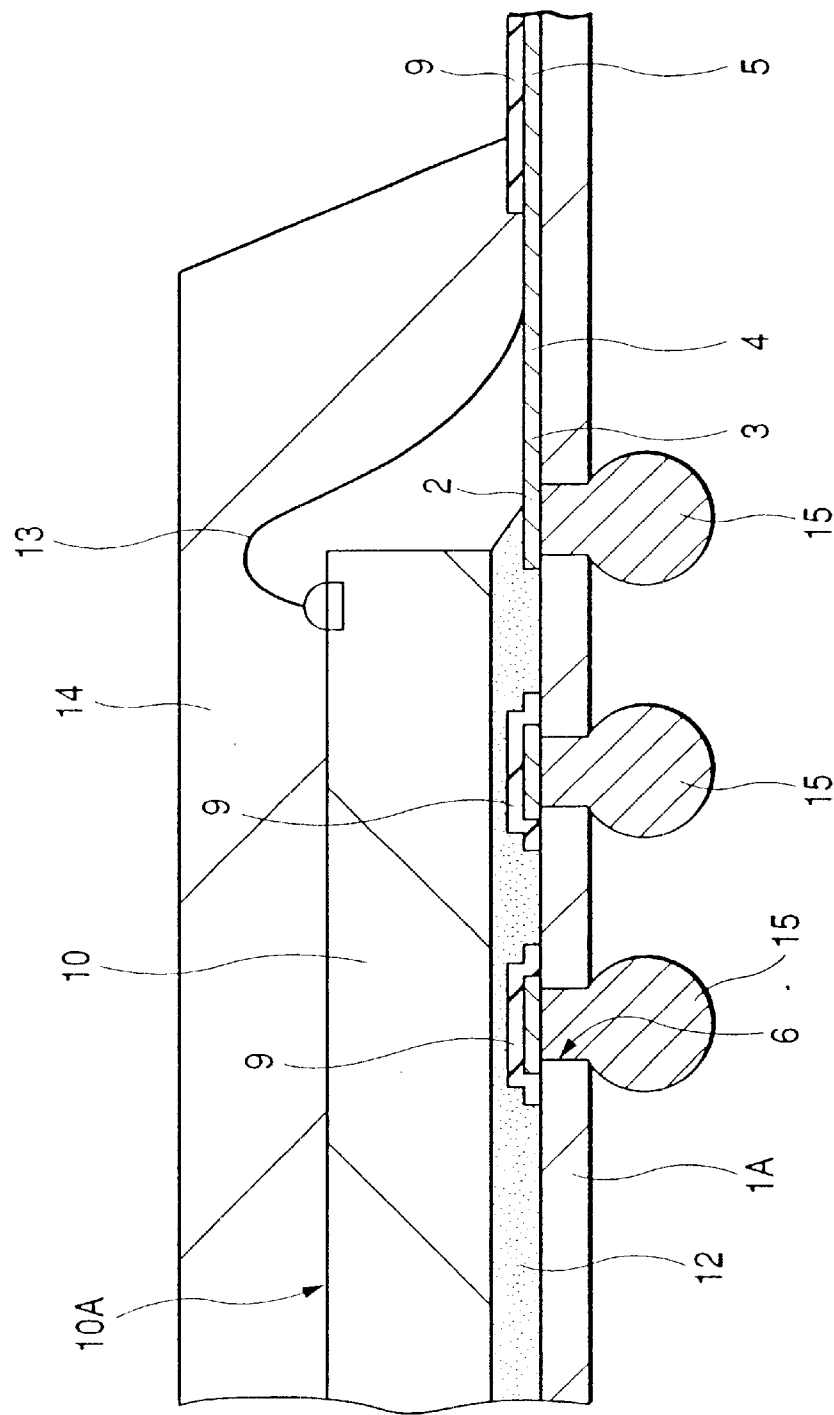
FIG. 17 is a cross-sectional view to explain a method of manufacturing the above semiconductor device.
Figure 18:
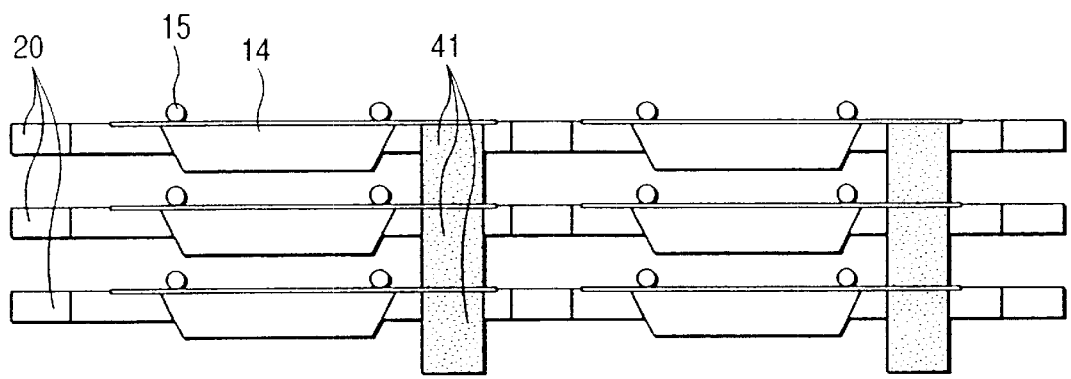
FIG. 18 is a diagram that shows a state in which the above frame structure was stacked to form multisteps.

Then, as shown in FIG. 17, bump electrodes 15 are connected to the back of electrode pads 2 for bump connection passing through connection holes 6 formed in film base material 1A. Bump electrodes 15 are supplied by carrying a ball on the substrate, for example, and are connected by melting in a infrared ray reflow process, etc. A transfer state after forming bump electrodes 15 is shown in FIG. 18. In case the frame structure 20 is stacked in several steps, a space between the frame structure 20 of an upper step and a lower step can be secured in sub-runner stiffened resin 41 provided in frame structure 20 of an upper step. Therefore, bump electrodes 15 of a semiconductor device manufactured in the frame structure 20 of a lower step can be protected. Because it can be carried in a state in which frame structure 20 is stacked in several steps, the ability to transfer the frame structure 20 is improved. And, the production reliability in the manufacturing process of a semiconductor device is improved.

Then, the cutting of the film base material 1A into a specified shape (base substrate shape) almost completes the semiconductor device with a base substrate 1 that comprises film base materials 1A. The semiconductor device is shipped as a product after this. The semiconductor device is shipped as a product is installed on the surface of printed circuit board.

The bump electrodes 15 can be connected as an individual element by cutting the film base material 1A after forming the resin sealing body 14.

Figure 19:
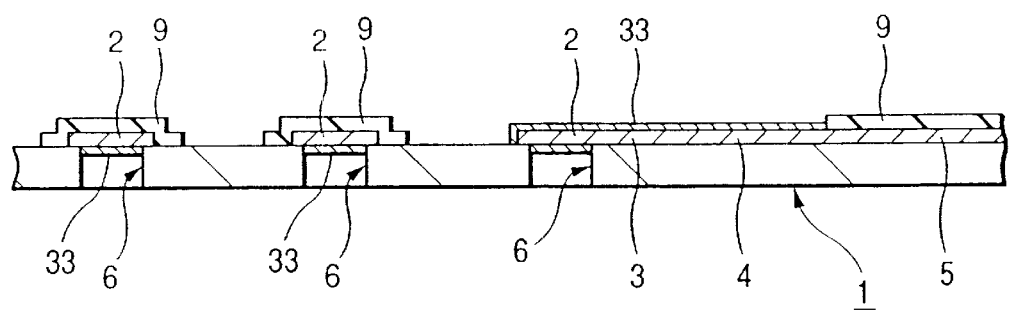
FIG. 19 is a cross-sectional view to explain a method of manufacturing the above frame structure.
Figure 20:
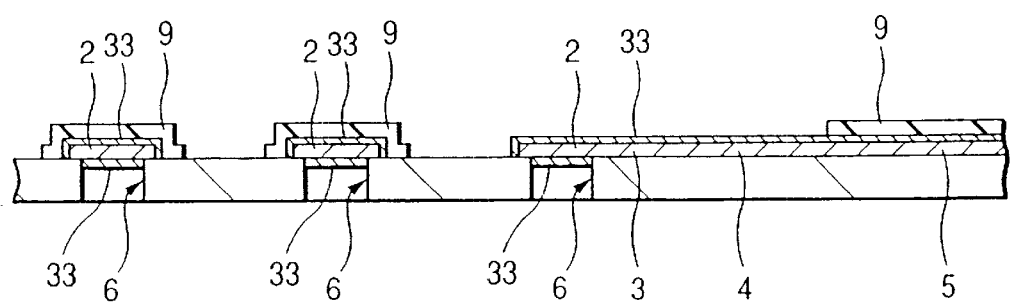
FIG. 20 is a cross-sectional view to explain a method of manufacturing the above frame structure.

The plating processing can be performed in the step before forming the insulation layers 9. In case plating processing is carried out in the step after forming the insulation layers 9, according to this embodiment, as shown in FIG. 19, plating layers 33 are formed on electrode pads 2 for bump connection, on the electric conductors 3 and on the electrode pads 4 for wire connection arranged in the peripheral area of the main surface of the base structure (film base material 1A) 1 and to the back of electrode pads 2 for bump connection. That is, plating layers 33 are not formed between electric conductor layers and insulation layers 9. In case plating processing is done in the step before forming the insulation layers 9, as shown in FIG. 20, plating layers 33 are formed on the electrode pads 2 for bump connection, on the electric conductors 3, on the electrode pads 4 for wire connection, on the electric conductors 5 for plating arranged at the periphery of the chip mount area of main surface of base substrate (film base material 1A) 1, and to the back electrode pads 2 for bump connection. That is, plating layers 33 are formed between electric conductor layers and insulation layers 9.

As explained above, according to this embodiment, the following effects are obtained.

(1) By dividing and arranging insulation layers 9 individually on the electric conductor layers, because a stress due to shrinkage or expansion and hardening of the insulation layers 9 is relieved, warping, distortion, etc. of the base substrate (film base material 1A) 1 can be suppressed.

And, because a deformation of the base substrate 1 can be suppressed, the yield in the manufacturing process of a semiconductor device is improved.

(2) By building the dam 8 that surrounds the periphery of the vent hole 7, the inflow of adhesive material 12 to the vent hole 7 can be stemmed and can be stopped. As a result, the prevention of a blockage of the vent hole 7 by adhesive material 12 and the intrusion of adhesive material 12 to he back side of film base material 1A can be prevented.

(3) When the semiconductor device is viewed from the back side of the base substrate 1, the arrangement of the vent hole 7 to a position that is deviated from the center of base substrate 1 can clear a direction as an index.

(4) By forming the insulation layers 9 using a printing method, low cost production of a semiconductor device can be attained as compared with a case where the insulation layers 9 are attached in the form of s sheet.

And, production reliability of a semiconductor device improves because the pattern of the insulation layers 9 can be freely set.

(5) By using a frame structure 20 in which the film base material 1A is arranged in a specified area of the frame body 21, the ability to transfer the film base material 1A in the manufacturing process of a semiconductor device is improved, and the handling of the manufacturing of a semiconductor device is improved.

(6) The intrusion of an alien substance that might occur at the time of sealing and cutting can be reduced by the formation of resin sealing body 14 according to a transfer molding method using a molding die assembly with a stepped portion 39 in which the frame body 21 of frame structure 20 is installed and stepped portion 40 in which the film base material 1A of the frame structure 20 is installed in a sub-runner path, because the resin burr that adheres to the film base material 1A and the frame body 21 can be prevented.

(7) In the state where there is a runner resin 41 in the frame body 21 of the frame structure 20, bump electrodes 15 are connected. In such a case, the frame structure 20 can be stacked to multisteps, and protection can be afforded for the bump electrodes 15 of a semiconductor device formed in the frame structure 20 of a lower position because a spaced relationship can be maintained between frame structure 20 of an upper position and frame structure 20 of a lower position. Therefore, the ability to transfer the frame structure 20 is improved because it can be carried in a state in which the frame structure 20 is stacked in multisteps. And, production reliability in the manufacturing process of a semiconductor device is improved.

(8) Because insulation layers 9 are arranged on electrode pads 2 for bump connection, when intercalating adhesive material 12 on the chip mount area of the main surface of the base substrate (film base material 1A) 1 and mounting a semiconductor chip 10 thereon, even if the semiconductor chip 10 is mounted in a state in which it is tilted, and the film thickness of the adhesive material 12 thins, the semiconductor chip 10 will not touch the electrode pads 2 for bump connection. Therefore, a short circuit between the electrode pads 2 for bump connection and the semiconductor chip 10 is prevented, that is, a short circuit between the electric conductor layers and the semiconductor chip 10 can be prevented.

And, even if the semiconductor chip 10 is mounted in a state in which it is tilted, and the film thickness of the adhesive material 12 thins, the semiconductor chip 10 touches the insulation layers 9 and is supported by the insulation layers 9. As a result, a short circuit between the electric conductors 3 and the semiconductor chip 10 is prevented, that is, a short circuit between the electric conductor layers and the semiconductor chip 10 can be prevented.

(9) Warping, distortion, etc. of the film base material 1A can be suppressed by providing slits 23 in the adhesion area of the frame body 21, because stress due to a difference between the materials of frame body 21 and the film base material 1A can be reduced.

While, in the above embodiment, an example of forming insulation layers 9 on electrode pads 2 for bump connection in the chip mount area of base substrate 1 was explained, the insulation layers 9 can be formed on electric conductors 3 as well. And, insulation layers 9 can be formed on electrode pads 2 for bump connection and on electric conductors 3. In such case, when intercalating adhesive material 12 on the chip mount area of the main surface of the base substrate (film base material 1A) 1 and mounting a semiconductor chip 10 thereon, similar to the above embodiment, even if the semiconductor chip 10 is mounted in a state in which the semiconductor chip 10 is tilted, and the film thickness of the adhesive material 12 thins, a short circuit between the electrode pads 2 for bump connection and the electric conductors 3 can be prevented, that is, a short circuit between the electric conductor layers and the semiconductor chip 10 can be prevented.

Figure 21:
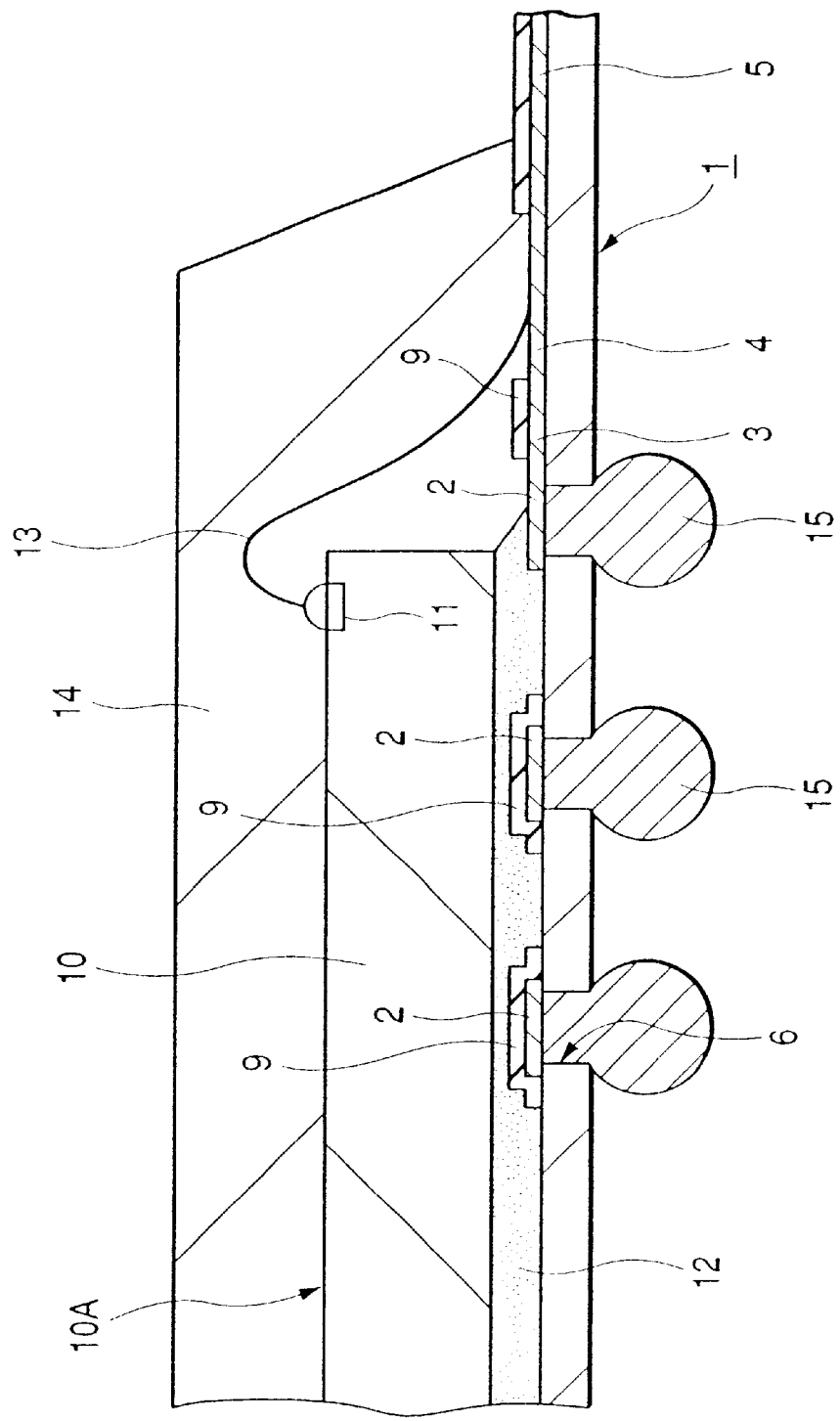
FIG. 21 is a cross-sectional view that shows an example of a first form of a semiconductor device representing one embodiment of this invention.
Figure 22:
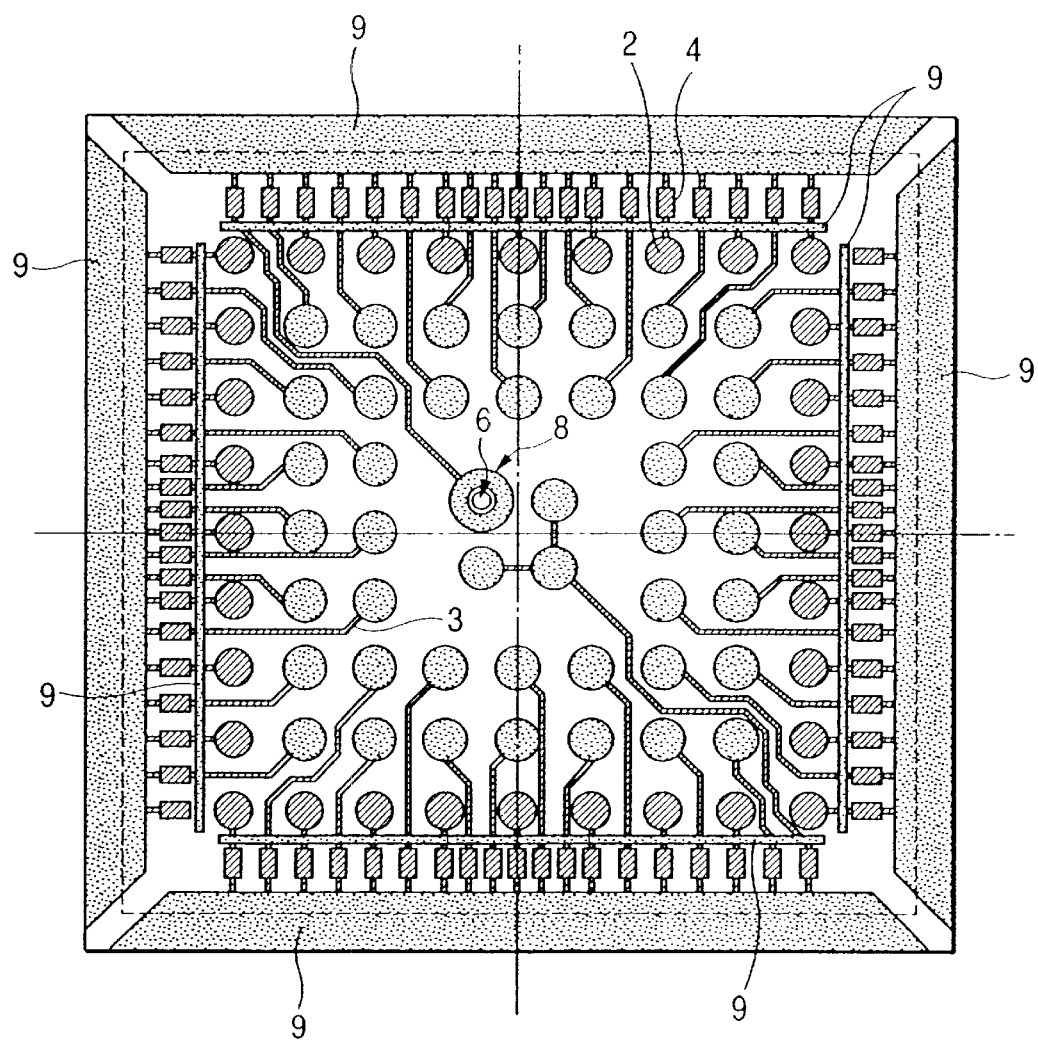
FIG. 22 is a plan view of the base substrate of a semiconductor device that represents one embodiment of this invention.

As shown in FIG. 21 and FIG. 22, insulation layers 9 can be individually provided on the base substrate 1 to arrange insulation layers 9 on respective electric conductors 3 in the peripheral area of the main surface of the base substrate 1 and in the area between semiconductor chip 10 and electrode pads 4 for wire connection. In this case, because wires 13 do not touch the electric conductors 3, a short circuit with other adjoining electric conductors 3 electrically connected to wires 13 and these wires 13 can be prevented from short-circuiting.

Figure 23:
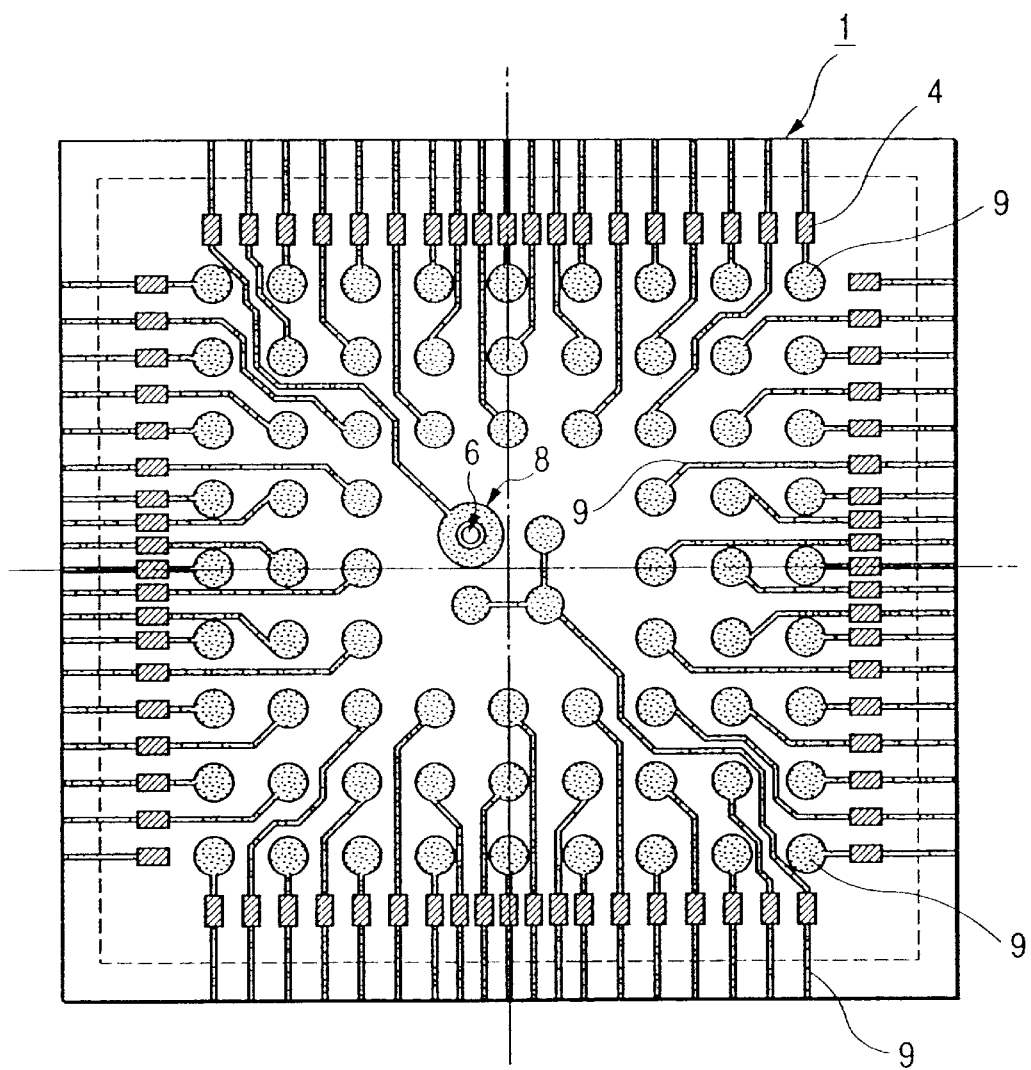
FIG. 23 is a plan view of a base substrate that represents a second example of a semiconductor device according to this invention.
Figure 24:
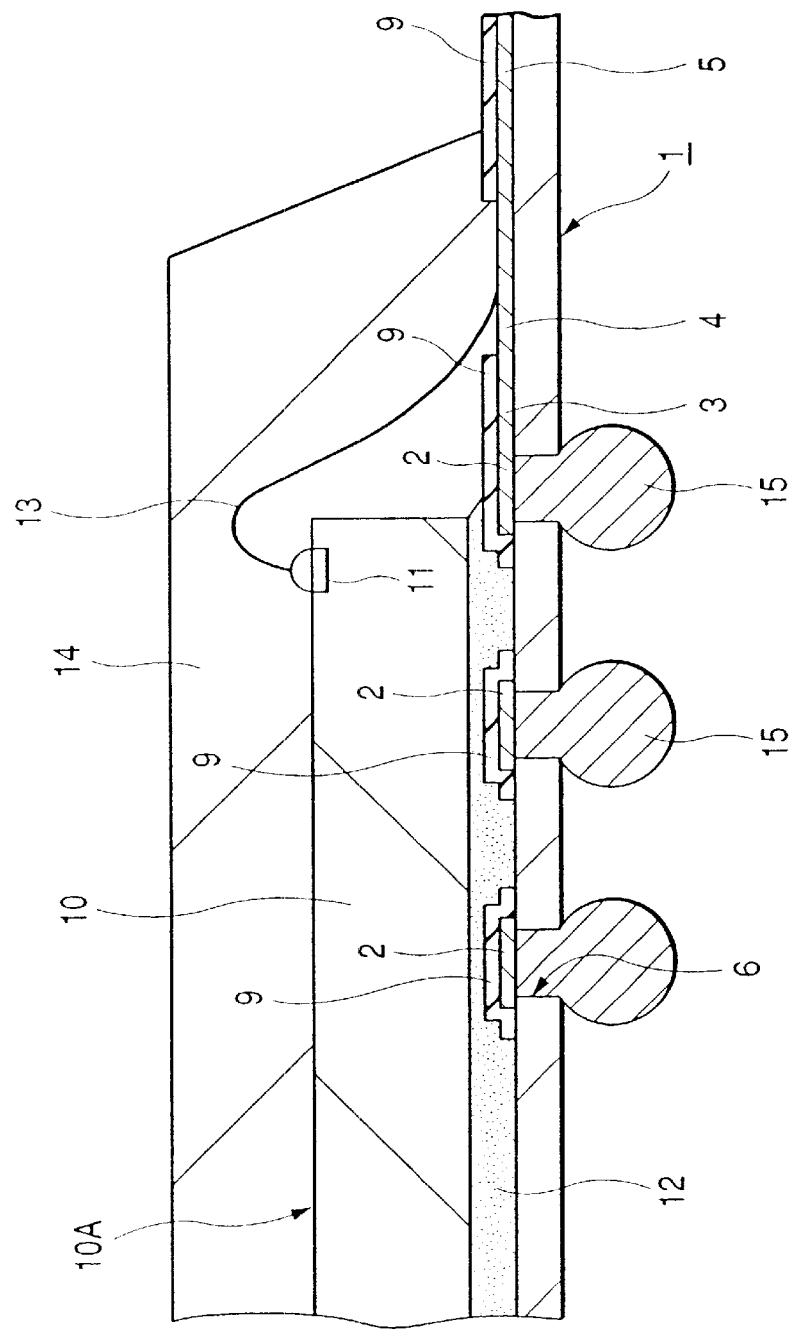
FIG. 24 is a cross-sectional view of a semiconductor device using the base substrate that is shown in FIG. 23.

As shown in FIG. 23 and FIG. 24, insulation layers 9 are divided into individual electric conductor layers on base substrate 1, and these insulation layers 9 are formed on all areas of the electric conductor layers (electrode pads 2 for bump connection, electric conductors 3 and electric conductors 5 for plating), except for the electrode pads 4 for wire connection. In this case, even if a conductive foreign material adheres between electric conductor layers in the manufacturing process of a semiconductor device, a short circuit between electric conductor layers can be prevented because the conductive foreign material does not touch the electric conductive layers.

Figure 25:
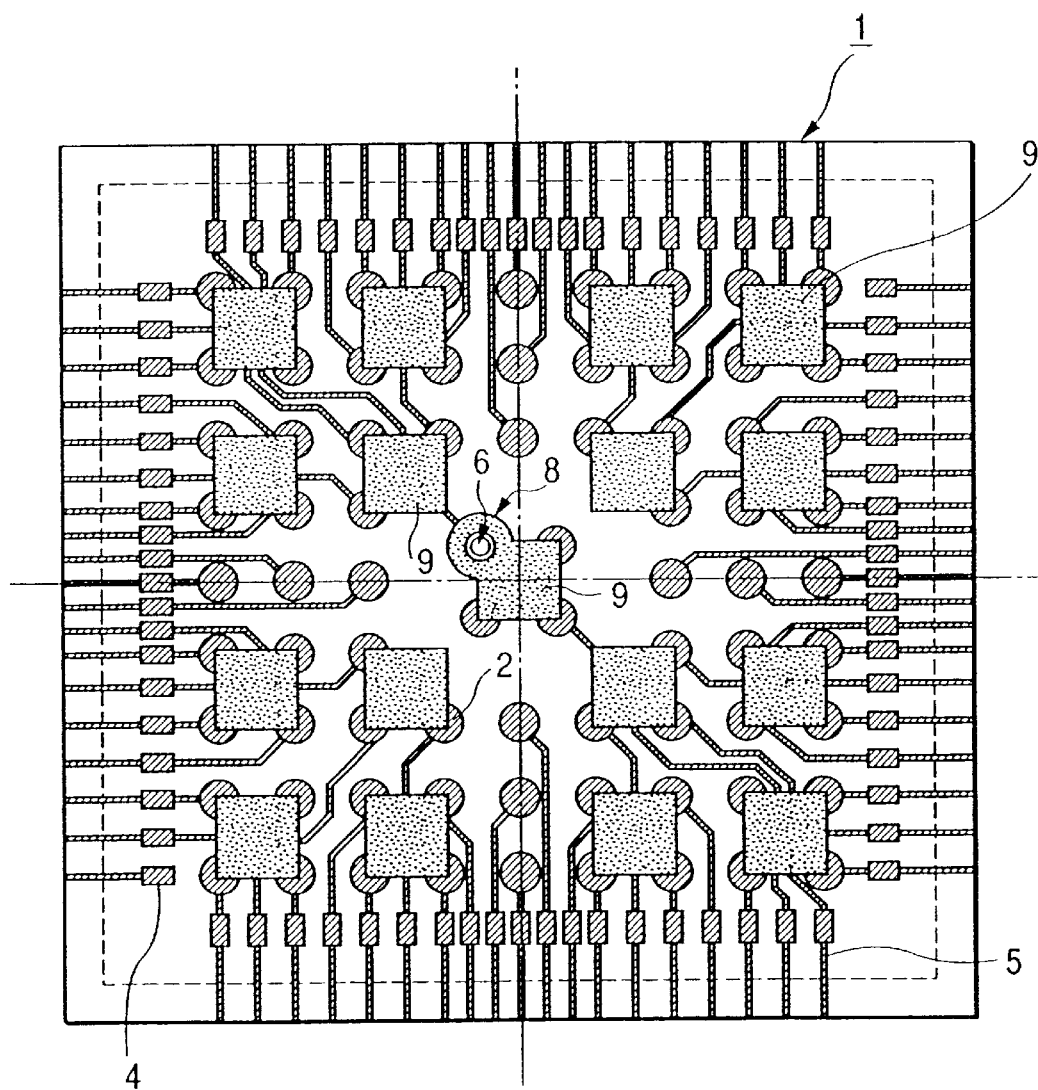
FIG. 25 is a plan view of a base substrate representing a third example of a semiconductor device according to this invention.

As shown in FIG. 25, insulation layers 9 can be divided into several parts on base substrate 1, and the individual insulation layers 9 can be arranged on the electric conductive layers. As for each of the several insulation layers 9, they are formed in a square shape in a specified space and in a matrix arrangement.

Figure 26:
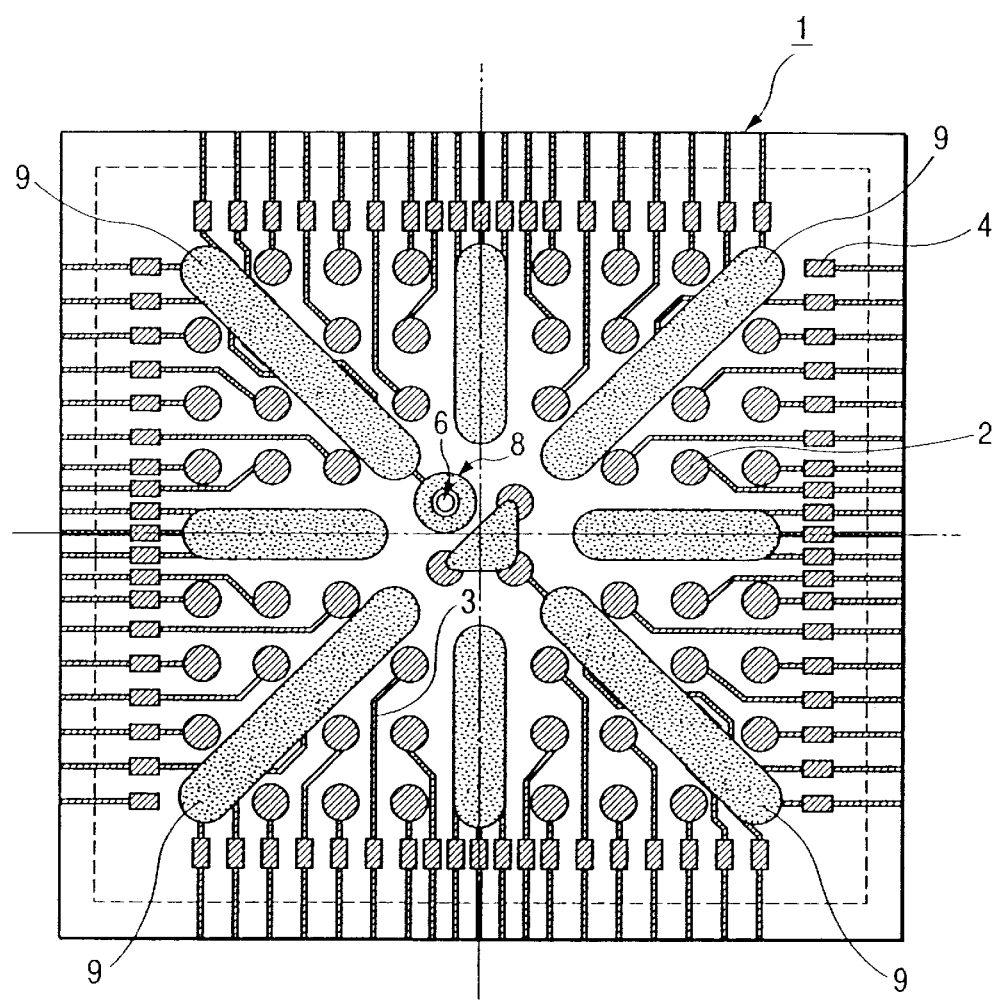
FIG. 26 is a plan view of a base substrate representing a fourth example of a semiconductor device according to this invention.

As shown in FIG. 26, insulation layers 9 can be divided into several parts on base substrate 1, and the insulation layers 9 can be arranged on the electric conductor layers. Each of several insulation layers 9 is formed to have an elongated shape and is radially arranged in a specified space.

Although a spherical bump electrode 15 was described as an example of an electrode that is arranged on the back side of the base substrate 1 in the above embodiment, as an electrode of this invention, an electrode having a protruding portion like a stud bump or even an electrode that is formed by the method of ball bonding can be used.

While the present invention was described on the basis of the above embodiment, this invention is not limited to the above embodiment, and it is possible to change it in a range that does not deviate from the gist of the invention.

The effect that is obtained by a representative aspect of the invention as disclosed in this application is easily explained as follows. In a semiconductor device having a base substrate that comprises flexible films, a deformation (warp and distortion) of the base substrate can be suppressed. In a semiconductor device having a base substrate that comprises flexible films, a short circuit between an electric conductor of the base substrate and the semiconductor chip can be prevented. Thus, in a semiconductor device having a base substrate that comprises flexible films, both a deformation of the base substrate and a short circuit between the electric conductor layers of the base substrate and connection wires can be prevented.

We claim:

1. A semiconductor device comprising:
   a base substrate comprised of film and having a first surface and a second surface that is opposed to said first surface;
   a plurality of electric conductor layers formed on said first surface of said base substrate;
   a semiconductor chip mounted through an adhesive material on said first surface of said base substrate and arranged over said plurality of electric conductor layers, said semiconductor chip having a plurality of semiconductor elements and a plurality of external terminals formed on its main surface;
   a plurality of insulation layers formed between said electric conductor layers and said semiconductor chip;
   a plurality of bonding wires to which said external terminals and said electric conductor layers are electrically connected, respectively;
   a plurality of bump electrodes arranged on said second surface and electrically connected with said electric conductor layers, and
   a resin member sealing said semiconductor chip, said electric conductor layers and said bonding wires;
   wherein said insulation layers are separated from each other in a plane view in an area on which said semiconductor chip is mounted, and
   wherein the semiconductor device further comprises a plurality of electric conductor layers for plating formed at the peripheral area of said semiconductor chip, wherein each of said electric conductor layers for plating extends continuous with one of said electric conductor layers and reaches to a side of said base substrate; and
   a plurality of insulation layers formed over said first surface of said base substrate and at said peripheral area of said semiconductor chip, so as to cover said plurality of electric conductor layers for plating.

2. A semiconductor device according to claim 1, wherein said insulation layer is divided into sections corresponding to each side of said base substrate.

* * * * *